United States Patent
Shinohara et al.

(10) Patent No.: US 6,852,370 B2
(45) Date of Patent: Feb. 8, 2005

(54) COMPOSITION FOR FILM FORMATION AND MATERIAL FOR INSULATING FILM FORMATION

(75) Inventors: Noriyasu Shinohara, Ibaraki (JP); Kaori Shirato, Ibaraki (JP); Michinori Nishikawa, Ibaraki (JP); Takashi Okada, Ibaraki (JP); Kinji Yamada, Ibaraki (JP)

(73) Assignee: JSR Corporation, Tokyo (JP)

( * ) Notice: Subject to any disclaimer, the term of this patent is extended or adjusted under 35 U.S.C. 154(b) by 244 days.

(21) Appl. No.: 10/102,710

(22) Filed: Mar. 22, 2002

(65) Prior Publication Data

US 2002/0172652 A1 Nov. 21, 2002

(30) Foreign Application Priority Data

Mar. 26, 2001 (JP) ........................................ 2001-088033

(51) Int. Cl.$^7$ .................................................. C08J 7/04
(52) U.S. Cl. ........................ 427/515; 525/474; 525/393
(58) Field of Search ................................ 525/474, 393; 427/515

(56) References Cited

U.S. PATENT DOCUMENTS

| 3,384,588 A | | 5/1968 | McMahon, Jr. et al. |
| 6,468,589 B2 | * | 10/2002 | Nishikawa et al. ...... 427/385.5 |

FOREIGN PATENT DOCUMENTS

| EP | 0 543 597 | 5/1993 |
| EP | 1 122 746 | 8/2001 |
| GB | 1 404 247 | 8/1975 |
| WO | WO 00/11096 | 3/2000 |
| WO | WO 01/19889 | 3/2001 |

* cited by examiner

*Primary Examiner*—Kuo-Liang Peng
(74) *Attorney, Agent, or Firm*—Oblon, Spivak, McClelland, Maier & Neustadt, P.C.

(57) ABSTRACT

A composition for film formation capable of forming a coating film excellent in low dielectric constant characteristics, cracking resistance, modulus of elasticity, and adhesion to substrates and useful as an interlayer insulating film material in semiconductor devices, etc. The composition for film formation contains (A) at least one member selected from an aromatic polyarylene and an aromatic poly(arylene ether), (B) a polyvinylsiloxane, and (C) an organic solvent.

16 Claims, No Drawings

COMPOSITION FOR FILM FORMATION AND MATERIAL FOR INSULATING FILM FORMATION

FIELD OF THE INVENTION

The present invention relates to a composition for film formation. More particularly, the invention relates to a composition for film formation capable of forming a coating film which has a low dielectric constant, is excellent in cracking resistance, modulus of elasticity, and adhesion to substrates, and is suitable for use as an interlayer insulating film material in semiconductor devices, etc.

DESCRIPTION OF THE RELATED ART

In the field of electronic materials, the recent progress toward a higher degree of integration, larger number of functions, and higher performances has resulted in increased circuit resistance and increased capacitance between wirings and this in turn has resulted in increases not only in power consumption but in delay time. The increase in delay time is a major factor contributing to a decrease in signal transfer speed in devices and to cross talks. Because of this, it is desired to reduce parasitic resistance or parasitic capacitance. One measure which is being taken in reducing the parasitic capacitance so as to cope with higher speed device operation is to coat the periphery of a circuit with a low dielectric constant interlayer insulating film. For use in LCDs and related products, such insulating films are required to have transparency besides low-dielectric-constant characteristics.

Polyimides are widely known as a heat-resistant organic material which meets those requirements. However, since polyimides contain imide groups, which are highly polar, they not only are insufficient in low dielectric constant characteristics and low water absorption but have a problem that they have a color. No satisfactory polyimides have been obtained.

On the other hand, polyphenylenes are known as an organic material having high heat resistance and containing no polar groups. Since these polyphenylenes have poor solubility in organic solvents although excellent in heat resistance, soluble groups are generally incorporated into side chains. Examples of such polyphenylenes include the polymers disclosed in U.S. Pat. No. 5,214,044, WO 96/28491, and EP 629217.

These polymers basically have a poly-p-phenylene structure as the main structure. Although the structural units of the polymers are partly derived from a flexible monomer used as a comonomer, the polymers are soluble only in specific organic solvents and have a problem that solutions thereof have a high viscosity due to the stiffness of the molecules. Those polyphenylenes are by no means satisfactory in processability.

Investigations have been made on the crosslinking of a polyphenylene polymer for the purposes of impartation of solvent resistance, improvement of physical heat resistance and mechanical properties, etc., and a crosslinking reaction utilizing an acetylene bond is known. However, this technique has problems that there are limitations on polyphenylene (polyarylene) structures into which the crosslink structure can be incorporated and on reactions usable for the crosslinking, and that the processing is unsuitable for general use because a special acetylene compound should be used as a starting material and a high temperature is necessary for curing.

Furthermore, a technique for enhancing the processability and solubility of a polyarylene by incorporating ether bonds into the polymer has been investigated. However, the polymer thus obtained has insufficient heat resistance.

As described above, there have been few polymer techniques which are widely applicable simple processes for imparting curability and are effective in improving low dielectric constant characteristics, cracking resistance, modulus of elasticity of coating, and adhesion to substrates.

SUMMARY OF THE INVENTION

An object of the invention, which has been achieved in view of the problems described above, is to provide a composition for film formation excellent in low dielectric constant characteristics, cracking resistance, modulus of elasticity of coating, and adhesion to substrates and suitable for use in forming an interlayer insulating film in the production of semiconductor devices, etc.

The invention provides a composition for film formation which comprises (A) at least one member selected from the group consisting of an aromatic polyarylene and an aromatic poly(arylene ether), (B) a polymer having repeating structural units represented by the following formula (1), and (C) an organic solvent,

wherein $R^1$ represents a hydrocarbon group having 1 to 5 carbon atoms and a is an integer of 2 to 1,000.

In the composition, ingredient (A) preferably comprises a polymer having at least one member selected from the group consisting of repeating structural units represented by the following formulae (2) to (5):

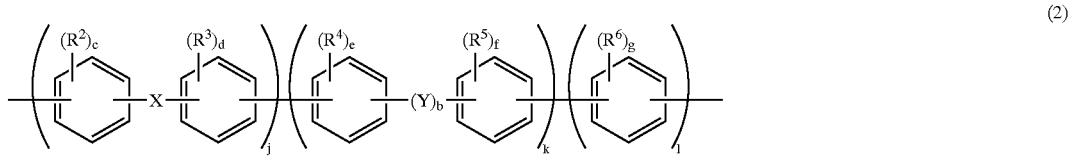

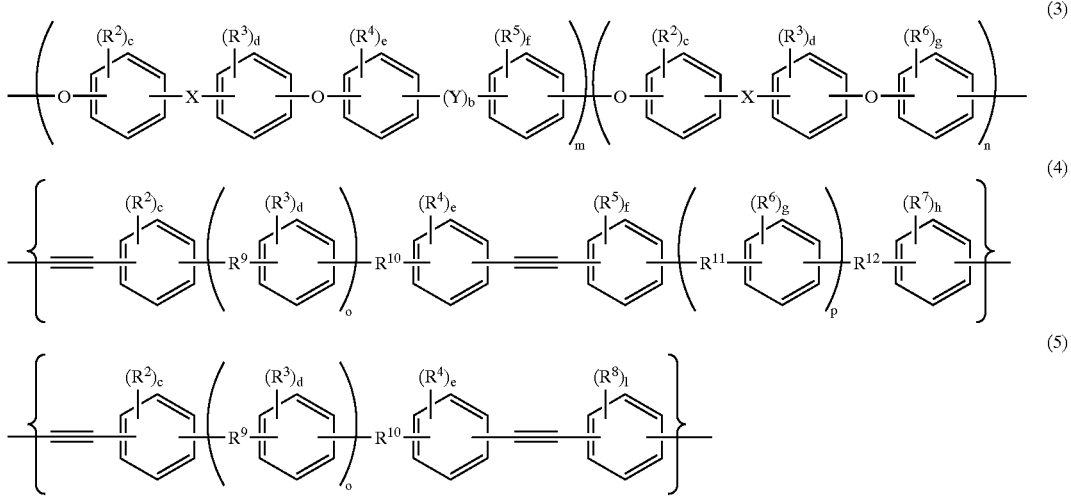

wherein $R^2$ to $R^8$ each independently represent a hydrocarbon group having 1 to 20 carbon atoms, a cyano group, a nitro group, an alkoxyl group having 1 to 20 carbon atoms, an aryl group, or a halogen atom; X is at least one member selected from the group consisting of groups represented by —CQQ'— (wherein Q and Q' may be the same or different and each represent a halogenoalkyl group, an alkyl group, a hydrogen atom, a halogen atom, or an aryl group) and a fluorenylene group; Y and $R^9$ to $R^{12}$ each independently are at least one member selected from the group consisting of —O—, —$CH_2$—, —CO—, —COO—, —CONH—, —S—, —$SO_2$—, and a phenylene group; b is 0 or 1, c to i each independently are an integer of 0 to 4; j is 5 to 100 mol %; k is 0 to 95 mol %; l is 0 to 95 mol % (provided that j+k+l=100 mol %); m is 0 to 100 mol %; n is 0 to 100 mol % (provided that m+n=100 mol %); o is an integer of 0 to 3; p is an integer of 0 to 3.

Ingredient (A) preferably comprises a polymer containing at least one member selected from the group consisting of alkyl groups having 1 to 20 carbon atoms, reactive double bonds, and reactive triple bonds.

The polymer constituting ingredient (B) is preferably a polymer represented by general formula (1).

Ingredient (A) and ingredient (B) are used preferably in such a proportion that the amount of ingredient (B) is from 0.001 to 10 parts by weight per 100 parts by weight of ingredient (A).

The invention further provides a material for insulating film formation which comprises the composition for film formation.

DETAILED DESCRIPTION OF THE INVENTION

Ingredient (A)

Ingredient (A) in the invention is at least one member selected from the group consisting of an aromatic polyarylene and an aromatic poly(arylene ether).

Ingredient (A) is preferably a polymer having at least one kind of repeating structural units which is selected from the group consisting of a polymer having repeating structural units represented by the formula (2) (hereinafter referred to also as "polymer (1)"), a polymer having repeating structural units represented by the formula (3) (hereinafter referred to also as "polymer (2)"), and a polymer having either or both of repeating structural units represented by the formula (4) and repeating structural units represented by the formula (5) (hereinafter referred to also as "polymer (3)").

From the standpoint of forming a coating film having improved heat resistance, ingredient (A) preferably comprises a polymer containing at least one member selected from the group consisting of hydrocarbon groups having 1 to 20 carbon atoms, reactive double bonds, and reactive triple bonds.

Polymer (1):

Polymer (1) can be produced, for example, by polymerizing one or more monomers comprising a compound represented by the following formula (6) in the presence of a catalyst system containing a transition metal compound.

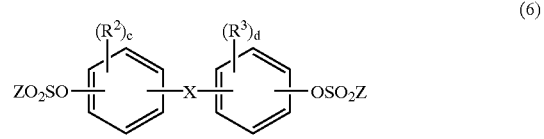

In the formula (6), $R^2$ and $R^3$ each independently represent a hydrocarbon group having 1 to 20 carbon atoms, a cyano group, a nitro group, an alkoxyl group having 1 to 20 carbon atoms, an aryl group, or a halogen atom; X is at least one member selected from the group consisting of groups represented by —CQQ'— (wherein Q and Q' may be the same or different and each represent a halogenoalkyl group, an alkyl group, a hydrogen atom, a halogen atom, or an aryl group) and a fluorenylene group; c and d each independently are an integer of 0 to 4; and Z represents an alkyl group, a halogenoalkyl group, or an aryl group.

Specific examples of Q and Q' which may be contained in X in the formula (6) are as follows. Examples of the alkyl group include methyl, ethyl, isopropyl, n-propyl, butyl, pentyl, and hexyl; examples of the halogenoalkyl group include trifluoromethyl and pentafluoroethyl; examples of the arylalkyl group include benzyl and diphenylmethyl; and examples of the aryl group include phenyl, biphenyl, tolyl, and pentafluorophenyl.

Specific examples of Z contained in —$OSO_2Z$ in the formula (6) are as follows. Examples of the alkyl group include methyl and ethyl; examples of the halogenoalkyl group include trifluoromethyl and pentafluoroethyl; and examples of the aryl group include phenyl, biphenyl, p-tolyl, and p-pentafluorophenyl.

Preferred examples of X in the formula (6) include the bivalent groups shown by the following formulae 7 to 12. More preferred of these is fluorenylene.

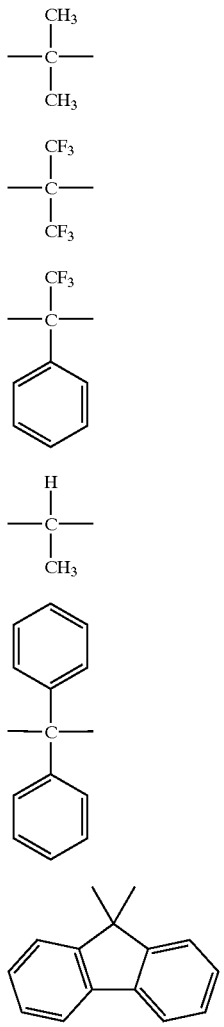

Specific examples of the compound (monomer) represented by the formula (6) include
2,2-bis(4-methylsulfonyloxyphenyl)hexafluoropropane,
bis(4-methylsulfonyloxyphenyl)methane,
bis(4-methylsulfonyloxyphenyl)diphenylmethane,
2,2-bis(4-methylsulfonyloxy-3-methylphenyl) hexafluoropropane,
2,2-bis(4-methylsulfonyloxy-3-propenylphenyl) hexafluoropropane,
2,2-bis(4-methylsulfonyloxy-3,5-dimethylphenyl) hexafluoropropane,
2,2-bis(4-methylsulfonyloxyphenyl)propane,
2,2-bis(4-methylsulfonyloxy-3-methylphenyl)propane,
2,2-bis(4-methylsulfonyloxy-3-propenylphenyl)propane,
2,2-bis(4-methylsulfonyloxy-3,5-dimethylphenyl) propane,
2,2-bis(4-methylsulfonyloxy-3-fluorophenyl)propane,
2,2-bis(4-methylsulfonyloxy-3,5-difluorophenyl) propane,
2,2-bis(4-trifluoromethylsulfonyloxyphenyl)propane,
2,2-bis(4-trifluoromethylsulfonyloxy-3-propenylphenyl) propane,
2,2-bis(4-phenylsulfonyloxyphenyl)propane,
2,2-bis(4-phenylsulfonyloxy-3-methylphenyl)propane,
2,2-bis(4-phenylsulfonyloxy-3-propenylphenyl)propane,
2,2-bis(4-phenylsulfonyloxy-3,5-dimethylphenyl) propane,
2,2-bis(4-phenylsulfonyloxy-3-fluorophenyl) diphenylmethane,
2,2-bis(p-tolylsulfonyloxyphenyl)propane,
2,2-bis(p-tolylsulfonyloxy-3-methylphenyl)propane,
2,2-bis(p-tolylsulfonyloxy-3-propenylphenyl)propane,
2,2-bis(p-tolylsulfonyloxy-3,5-dimethylphenyl)propane,
2,2-bis(p-tolylsulfonyloxy-3-methylphenyl)propane,
2,2-bis(p-tolylsulfonyloxy-3,5-dimethylphenyl)propane,
2,2-bis(p-tolylsulfonyloxy-3-propenylphenyl)propane,
bis (p-tolylsulfonyloxy-3-fluorophenyl)propane,
bis(p-tolylsulfonyloxy-3,5-diflluorophenyl)propane,
9,9-bis(4-methylsulfonyloxyphenyl)fluorene,
9,9-bis(4-methylsulfonyloxy-3-methylphenyl)fluorene,
9,9-bis(4-methylsulfonyloxy-3,5-dimethylphenyl) fluorene,
9,9-bis(4-methylsulfonyloxy-3-propenylphenyl)fluorene,
9,9-bis(4-methylsulfonyloxy-3-phenylphenyl)fluorene,
bis(4-methylsulfonyloxy-3-methylphenyl) diphenylmethane,
bis(4-methylsulfonyloxy-3,5-dimethylphenyl) diphenylmethane,
bis(4-methylsulfonyloxy-3-propenylphenyl) diphenylmethane,
bis(4-methylsulfonyloxy-3-fluorophenyl) diphenylmethane,
bis(4-methylsulfonyloxy-3,5-difluorophenyl) diphenylmethane,
9,9-bis(4-methylsulfonyloxy-3-fluorophenyl)fluorene,
9,9-bis(4-methylsulfonyloxy-3,5-difluorophenyl) fluorene,
bis(4-methylsulfonyloxyphenyl)methane,
bis(4-methylsulfonyloxy-3-methylphenyl)
bis(4-methylsufonyloxy-3,5-dimethylphenyl)methane,
bis(4-methylsulfonyloxy-3-propenylphenyl)methane,
bis(4-methylsulfonyloxyphenyl) trifluoromethylphenylmethane,
bis(4-methylsufonyloxyphenyl)phenylmethane,
2,2-bis(4-trifluoromethylsufonyloxyphenyl) hexafluoropropane,
bis(4-trifluoromethylsufonyloxyphenyl)methane,
bis(4-trifluoromethylsulfonyloxyphenyl) diphenylmethane,
2,2-bis(4-trifluoromethylsulfonyloxy-3-methylphenyl) hexafluoropropane,
2,2-bis(4-trifluoromethylsulfonyloxy-3-propenylphenyl) hexafluoropropane,
2,2-bis(4-trifluoromethylsulfonyloxy-3,5-dimethylphenyl)hexafluoropropane,
9,9-bis(4-trifluoromethylsulfonyloxyphenyl)fluorene,
9,9-bis(4-trifluoromethylsulfonyloxy-3-methylphenyl) fluorene,
9,9-bis(4-trifluoromethylsulfonyloxy-3,5-dimethylphenyl)fluorene,
9,9-bis(4-trifluoromethylsulfonyloxy-3-propenylphenyl) fluorene,
9,9-bis(4-trifluoromethylsulfonyloxy-3-phenylphenyl) fluorene,
bis(4-trifluoromethylsulfonyloxy-3-methylphenyl) diphenylmethane,
bis(4-trifluoromethylsufonyloxy-3,5-dimethylphenyl) diphenylmethane,
bis(4-trifluoromethylsulfonyloxy-3-propenylphenyl) diphenylmethane, bis(4-trifluoromethylsulfolyloxy-3-fluorophenyl)diphenylmethane,
bis(4-trifluoromethylsulfonyloxy-3,5-difluorophenyl)diphenylmethane,
9,9-bis(4-trifluoromethylsulfonyloxy-3-fluorophenyl)fluorene,
9,9-bis(4-trifluoromethylsulfonyloxy-3,5-difluorophenyl)fluorene,
bis(4-trifluoromethylsulfonyloxyphenyl)methane,
bis(4-trifluoromethylsulfonyloxy-3-methylphenyl)methane,
bis(4-trifluoromethylsulfonyloxy-3,5-dimethylphenyl)methane,
bis(4-trifluoromethylsulfonyloxy-3-propenylphenyl)methane,
bis(4-trifluoromethylsulfonyloxyphenyl)trifluoromethylphenylmethane,
bis(4-trifluoromethylsulfonyloxyphenyl),
2,2-bis(4-phenylsulfonyloxyphenyl)hexafluoropropane,
bis(4-phenylsulfonyloxyphenyl)methane,
bis(4-phenylsulfonyloxyphenyl)diphenylmethane,
2,2-bis(4-phenylsulfonyloxy-3-methylphenyl)hexafluoropropane,
2,2-bis(4-phenylsulfonyloxy-3-propenylphenyl)hexafluoropropane,
2,2-bis(4-phenylsulfonyloxy-3,5-dimnethylphenyl)hexafluoropropane,
9,9-bis(4-phenylsulfonyloxyphenyl)fluorene,
9,9-bis(4-phenylsulfonyloxy-3-methylphenyl)fluorene,
9,9-bis(4-phenylsulfonyloxy-3,5-dimethylphenyl)fluorene,
9,9-bis(4-phenylsulfonyloxy-3-propenylphenyl)fluorene,
9,9-bis(4-phenylsulfonyloxy-3-phenylphenyl)fluorene,
bis(4-phenylsulfonyloxy-3-methylphenyl)diphenylmethane,
bis(4-phenylsulfonyloxy-3,5-dimethylphenyl)diphenylmethane,
bis(4-phenylsulfonyloxy-3-propenylphenyl)diphenylmethane,
bis(4-phenylsulfonyloxy-3-fluorophenyl)diphenylmethane,
bis(4-phenylsulfonyloxy-3,5-difluorophenyl)diphenylmethane,
9,9-bis(4-phenylsulfonyloxy-3-fluorophenyl)fluorene,
9,9-bis(4-phenylsulfonyloxy-3,5-difluorophenyl)fluorene,
bis(4-phenylsulfonyloxyphenyl)methane,
bis(4-phenylsulfonyloxy-3-methylphenyl)methane,
bis(4-phenylsulfonyloxy-3,5-dimethylphenyl)methane,
bis(4-phenylsulfonyloxy-3-propenylphenyl)methane,
bis(4-phenylsulfonyloxyphenyl)trifluoromethylphenylmethane,
bis(4-phenylsulfonyloxyphenyl)phenylmethane,
2,2-bis(p-tolylsulfonyloxyphenyl)hexafluoropropane,
bis(p-tolylsulfonyloxyphenyl)methane,
bis(p-tolylsulfonyloxyphenyl)diphenylmethane,
2,2-bis(p-tolylsulfonyloxy-3-methylphenyl)hexafluoropropane,
2,2-bis(p-tolylsulfonyloxy-3-propenylphenyl)hexafluoropropane,
2,2-bis(p-tolylsulfonyloxy-3,5-dimethylphenyl)hexafluoropropane,
9,9-bis(p-tolylsulfonyloxyphenyl)fluorene,
9,9-bis(p-tolylsulfonyloxy-3-methylphenyl)fluorene,
9,9-bis(p-tolylsulfonyloxy-3,5-dimethylphenyl)fluorene,
9,9-bis(p-tolylsulfonyloxy-3-propenylphenyl)fluorene,
9,9-bis(p-tolylsulfonyloxy-3-phenylphenyl)fluorene,
bis(p-tolylsulfonyloxy-3-methylphenyl)diphenylmethane,
bis(p-tolylsulfonylony-3,5-dimethylphenyl)diphenylmethane,
bis(p-tolylsulfonyloxy-3-propenylphenyl)diphenylmethane,
bis(p-tolylsulfonyloxy-3-fluorophenyl)diphenylmethane,
bis(p-tolylsulfonyloxy-3,5-difluorophenyl)diphenylmethane,
9,9-bis(p-tolylsulfonyloxy-3-fluorophenyl)fluorene,
9,9-bis(p-tolylsulfonyloxy-3,5-difluorophenyl)fluorene,
bis(p-tolylsulfonyloxyphenyl)methane,
bis(p-tolylsulfonyloxy-3-methylphenyl)methane,
bis(p-tolylsulfonyloxy-3,5-dimethylphenyl)methane,
bis(p-tolylsulfonyloxy-3-propenylphenyl)methane,
bis(p-tolylsulfonyloxyphenyl)trifluoromethylphenylmethane, and
bis(p-tolylsulfonyloxyphenyl)phenylmethane.

The compounds represented by the formula (6) can be synthesized, for example, by the following processes.

First, a dihydroxy compound having two hydroxyl groups, e.g., 2,2-bis(4-hydroxyphenyl)hexafluoropropane, and a base are dissolved in a solvent, the amount of the base being at least two equivalents to the dihydroxy compound. Pyridine or the like may be used as this solvent so as to function as both a solvent and a base. A catalyst such as, e.g., 4-dimethylaminopyridine may be added according to need.

Subsequently, a sulfonyl chloride or anhydride thereof, e.g., methanesulfonyl chloride, is dropped into the solution in a dry nitrogen stream over 5 to 60 minutes, while keeping the solution at 15° C. or lower. The resultant mixture is stirred at that temperature for from 0 to 60 minutes and then at room temperature for from 0 to 24 hours to prepare a suspension. The suspension obtained is poured into a 3- to 20-fold amount of ice water to cause reprecipitation, and the precipitate is recovered. This precipitate is repeatedly subjected to an operation such as recrystallization. Thus, a bissulfonate compound can be obtained as crystals.

Alternatively, a dihydroxy compound, e.g., 2,2-bis(4-hydroxyphenyl)hexafluoropropane, is first dissolved in an aqueous solution of two equivalents of an alkali, e.g., sodium hydroxide. On the other hand, a sulfonyl chloride or anhydride thereof, e.g. ,methanesulfonyl chloride, is dissolved in an organic solvent such as toluene or chloroform. Subsequently, a phase-transfer catalyst such as acetyltrimethylammonium chloride is added to these solutions according to need, and a mixture of the solutions is vigorously agitated. Thereafter, the organic layer obtained through the reaction is purified. By this method also, the target bissulfonate compound can be obtained.

In the invention, at least one compound represented by the formula (6) may be copolymerized with at least one member selected from the group consisting of compounds represented by the following formulae (13) and (14).

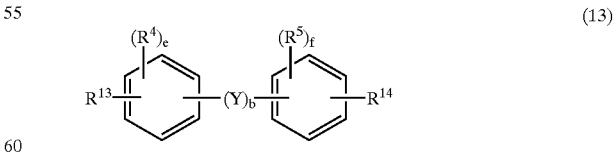

(13)

In the formula (13), $R^4$ and $R^5$ each independently represent a hydrocarbon group having 1 to 20 carbon atoms, a cyano group, a nitro group, an alkoxyl group having 1 to 20 carbon atoms, an aryl group, or a halogen atom; $R^{13}$ and $R^{14}$ each represent —$OSO_2Z$ (wherein Z represents an alkyl group, a halogenoalkyl group, or an aryl group), a chlorine atom, a bromine atom, or an iodine atom; Y represents at least one member selected from the group consisting of —O—, —CH$_2$—, —CO—, —COO—, —CONH—, —S—, —SO$_2$—, and a phenylene group; b is 0 or 1; and e and f each are an integer of 0 to 4.

Specific examples of R$^4$ and R$^5$ are as follows. Examples of the halogen atom include fluorine. Examples of the monovalent organic groups include alkyl groups such as methyl and ethyl, halogenoalkyl groups such as trifluoromethyl and pentafluoroethyl, alkenyl groups such as allyl and propenyl, and aryl groups such as phenyl and pentafluorophenyl. Examples of Z contained in —OSO$_2$Z include alkyl groups such as methyl and ethyl, halogenoalkyl groups such as trifluoromethyl, and aryl groups such as phenyl, p-tolyl, and p-fluorophenyl.

Examples of the compounds represented by general formula (13) include
4,4'-dimethylsulfonyloxybiphenyl,
4,4'-dimethylsulfonyloxy-3,3'-dipropenylbiphenyl,
4,4'-dibromobiphenyl, 4,4'-duiodobiphenyl,
4,4'-dimethylsulfonyloxy-3,3'-dimethylbiphynyl,
4,4'-dimethylsulfonyloxy-3,3'-difluorobiphenyl,
4,4'-dimethylsulfonyloxy-3,3',5,5'-tetrafluorobiphenyl,
4,4'-dibromooctafluorobiphenyl,
4,4'-methylsulfonyloxyoctafluorobiphenyl,
3,3'-diallyl-4,4'-bis(4-fluorobenzenesulfonyloxy) biphenyl,
4,4'-dichloro-2,2'-trifluoromethylbiphenyl,
4,4'-dibromo-2,2'-trifluoromethylbiphenyl,
4,4'-diiodo-2,2'-trifluoromethylbiphenyl,
bis(4-chlorophenyl) sulfone,
4,4'-dichlorobenzophenone, and
2,4-dichlorobenzophenone.

The compounds represented by the formula (13) can be used alone or in combination of two or more thereof.

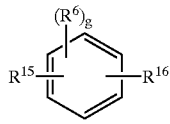

(14)

In the formula (14), R$^6$ represents a hydrocarbon group having 1 to 20 carbon atoms, a cyano group, a nitro group, an alkoxyl group having 1 to 20 carbon atoms, an aryl group, or a halogen atom; R$^{15}$ and R$^{16}$ each represent —OSO$_2$Z (wherein Z represents an alkyl group, a halogenoalkyl group, or an aryl group), a chlorine atom, a bromine atom, or an iodine atom; and g is an integer of 0 to 4.

Specific examples of R$^6$ are as follows. Examples of the halogen atom include fluorine. Examples of the monovalent organic groups include alkyl groups such as methyl and ethyl, halogenoalkyl groups such as trifluoromethyl and pentafluoroethyl, alkenyl groups such as allyl and propenyl, and aryl groups such as phenyl and pentafluorophenyl. Examples of Z contained in —OSO$_2$Z include alkyl groups such as methyl and ethyl, halogenoalkyl groups such as trifluoromethyl, and aryl groups such as phenyl, p-tolyl, and p-fluorophenyl.

Examples of the compounds represented by the formula (14) include
o-dichlorobenzene, o-dibromobenzene, o-diiodobenzene, o-dimethylsulfonyloxybenzene, 2,3-dichlorotoluene, 2,3-dibromotoluene, 2,3-diiodotoluene, 3,4-dichlorotoluene, 3,4-dibromotoluene, 3,4-diiodotoluene, 2,3-dimethylsulfonyloxybenzene, 3,4-dimethylsulfonyloxybenzene, m-dichlorobenzene, m-dibromobenzene, m-diiodobenzene, m-dimethylsulfonyloxybenzene, 2,4-dichlorotoluene, 2,4-dibromotoluene, 2,4-diiodotoluene, 3,5-dichlorotoluene, 3,5-dibromotoluene, 3,5-diiodotoluene, 2,6-dichlorotoluene, 2,6-dibromotoluene, 2,6-diiodotoluene, 3,5-dimethylsulfonyloxytoluene, 2,6-dimethylsulfonyloxytoluene, 2,4-dichlorobenzotrifluoride, 2,4-dibromobenzotrifluoride, 2,4-diiodobenzotrifluoride, 3,5-dichlorobenzotrifluoride, 3,5-dibromotrifluoride, 3,5-diiodobenzotrifluoride, 1,3-dibromo-2,4,5,6-tetrafluorobenzene, 2,4-dichlorobenzyl alcohol, 3,5-dichlorobenzyl alcohol, 2,4-dibromobenzyl alcohol, 3,5-dibromobenzyl alcohol, 3,5-dichlorophenol, 3,5-dibromophenol, 3,5-dichloro-t-butoxycarbonyloxyphenyl, 3,5-dibromo-t-butoxycarbonyloxyphenyl, 2,4-dichlorobenzoic acid, 3,5-dichlorobenzoic acid, 2,4-dibromobenzoic acid, 3,5-dibromobenzoic acid, methyl 2,4-dichlorobenzoate, methyl 3,5-dichlorobenzoate, methyl 3,5-dibromobenzoate, methyl 2,4-dibromobenzoate, t-butyl 2,4-dichlorobenzoate, t-butyl 3,5-dichlorobenzoate, t-butyl 2,4-dibromobenzoate, and t-butyl 3,5-dibromobenzoate. Preferred of these are m-dichlorobenzene, 2,4-dichlorotoluene, 3,5-dimethylsulfonyloxytoluene, 2,4-dichlorobenzotrifluoride, 2,4-dichlorobenzophenone, 2,4-dichlorophenoxybenzene, and the like.

The compounds represented by the formula (14) can be used alone or in combination of two or more thereof.

In polymer (1), the repeating structural units are contained in such a proportion that in the formula (1), j is from 5 to 100% by mole, k is from 0 to 95% by mole, and 1 is from 0 to 95% by mole (provided that j+k+l=100% by mole).

The catalyst to be used in producing the polymer (1) for use in the invention is preferably a catalyst system containing a transition metal compound. This catalyst system comprises, as essential ingredients, (i) either a combination of a transition metal salt and one or more ligands or a transition metal (salt) having one or more ligands coordinated thereto and (ii) a reducing agent. A salt may be added to the catalyst system in order to heighten the rate of polymerization.

Examples of the transition metal salt include nickel compounds such as nickel chloride, nickel bromide, nickel iodide, and nickel acetylacetonate, palladium compounds such as palladium chloride, palladium bromide, and palladium iodide, iron compounds such as iron chloride, iron bromide, and iron iodide, and cobalt compounds such as cobalt chloride, cobalt bromide, and cobalt iodide. Especially preferred of these are nickel chloride and nickel bromide.

Examples of the ligands include triphenylphosphine, 2,2'-bipyridine, 1,5-cyclooctadiene, and 1,3-bis (diphenylphosphino)propane. Preferred of these are triphenylphosphine and 2,2'-bipyridine. These ligands may be used alone or in combination of two or more thereof.

Examples of the transition metal (salt) having one or more ligands coordinated thereto include nickel chloride bis (triphenylphosphine), nickel bromide bis (triphenylphosphine), nickel iodide bis(triphenylphosphine), nickel nitrate bis(triphenylphosphine), nickel chloride 2,2'-bipyridine, nickel bromide 2,2'-bipyridine, nickel iodide 2,2'-bipyridine, nickel nitrate 2,2'-bipyridine, bis(1,5-cyclooctadiene)nickel, tetrakis(triphenylphosphine)nickel, tetrakis(triphenylphosphite)nickel, and tetrakis (triphenylphosphine)palladium. Preferred of these are nickel chloride bis(triphenylphosphine) and nickel chloride 2,2'-bipyridine.

Examples of the reducing agent which can be used in the catalyst system include iron, zinc, manganese, aluminum, magnesium, sodium, and calcium. Preferred of these are zinc and manganese. These reducing agents can be used after having been further activated by contact with an acid or an organic acid.

Examples of the salt which can be optionally used in the catalyst system include sodium compounds such as sodium fluoride, sodium chloride, sodium bromide, sodium iodide, and sodium sulfate, potassium compounds such as potassium fluoride, potassium chloride, potassium bromide, potassium iodide, and potassium sulfate, and ammonium compounds such as tetraethylammonium fluoride, tetraethylammonium chloride, tetraethylammonium bromide, tetraethylammonium iodide, and tetraethylammonium sulfate. Preferred of these are sodium bromide, sodium iodide, potassium bromide, tetraethylammonium bromide, and tetraethylammonium iodide.

In the catalyst system, the proportions of the ingredients to be used therein are as follows. The proportion of either the transition metal salt or the transition metal (salt) having one or more ligands coordinated thereto is generally from 0.0001 to 10 mol, preferably from 0.01 to 0.5 mol, per mol of the total amount of the compound represented by general formula (6), the compound represented by general formula (13), and the compound represented by general formula (14). In case where the proportion thereof is smaller than 0.0001 mol, the polymerization reaction does not proceed sufficiently. On the other hand, when the proportion thereof exceeds 10 mol, there are cases where the polymerization yields a polymer having a low molecular weight.

In the case where the catalyst system comprises a transition metal salt and one or more ligands, the proportion of the ligands is generally from 0.1 to 100 mol, preferably from 1 to 10 mol, per mol of the transition metal salt. Proportions thereof smaller than 0.1 mol result in insufficient catalytic activity. On the other hand, proportions thereof exceeding 100 mol pose a problem that the polymerization yields a polymer having a low molecular weight.

The proportion of the reducing agent to be used in the catalyst system is generally from 0.1 to 100 mol, preferably from 1 to 10 mol, per mol of the total amount of the compound represented by the formula (6), the compound represented by the formula (13), and the compound represented by the formula (14). In case where the proportion thereof is smaller than 0.1 mol, the polymerization does not proceed sufficiently. On the other hand, when the proportion thereof exceeds 100 mol, there are cases where the polymer obtained is difficult to purify.

In the case where the salt as an optional ingredient is used in the catalyst system, the proportion thereof is generally from 0.001 to 100 mol, preferably from 0.01 to 1 mol, per mol of the total amount of the compound represented by the formula (6), the compound represented by the formula (13), and the compound represented by the formula (14). In case where the proportion thereof is smaller than 0.001 mol, the effect of heightening the rate of polymerization is insufficient. On the other hand, when the proportion thereof exceeds 100 mol, there are cases where the polymer obtained is difficult to purify.

Examples of polymerization solvents which can be used in the invention include tetrahydrofuran, cyclohexanone, dimethyl sulfoxide, N,N-dimethylformamide, N,N-dimethylacetamide, 1-methyl-2-pyrrolidone, γ-butyrolactone, and γ-butyrolactam. Preferred of these are tetrahydrofuran, N,N-dimethylformamide, N,N-dimethylacetamide, and 1-methyl-2-pyrrolidone. It is preferred to sufficiently dry these polymerization solvents before use.

The total concentration of the compound represented by the formula (6), the compound represented by the formula (13), and the compound represented by the formula (14) in the polymerization solvent is generally from 1 to 100% by weight, preferably from 5 to 40% by weight.

The polymerization for yielding the polymer (1) is conducted at a temperature of generally from 0 to 200° C., preferably from 50 to 80° C., for a period of usually from 0.5 to 100 hours, preferably from 1 to 40 hours.

The polymer (1) described above has a weight average molecular weight, calculated for standard polystyrene, of generally from 1,000 to 1,000,000.

Polymer (2):

Polymer (2), which is represented by the formula (3), can be produced, for example, by polymerizing monomers comprising compounds represented by the following formulae (15) to (17) in the presence of a catalyst system.

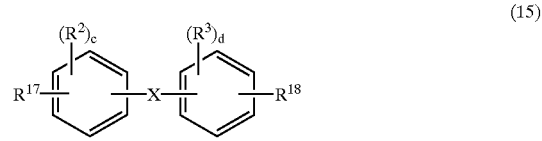

(15)

In the formula (15), $R^2$ and $R^3$ each independently represent a hydrocarbon group having 1 to 20 carbon atoms, a cyano group, a nitro group, an alkoxyl group having 1 to 20 carbon atoms, an aryl group, or a halogen atom; X is at least one member selected from the group consisting of groups represented by —CQQ'— (wherein Q and Q' may be the same or different and each represent a halogenoalkyl group, an alkyl group, a hydrogen atom, a halogen atom, or an aryl group) and a fluorenylene group; c and d each are an integer of 0 to 4; and $R^{17}$ and $R^{18}$ each represent at least one member selected from the group consisting of a hydroxyl group, a halogen atom, and an —OM group (wherein M is an alkali metal).

Examples of the compound (monomer) represented by the formula (15) include 2,2-bis(4-hydroxyphenyl)hexafluoropropane,
bis(4-hydroxyphenyl)methane,
bis(4-hydroxyphenyl)diphenylmethane,
2,2-bis(4-hydroxy-3-methylphenyl)hexafluoropropane,
2,2-bis(4-hydroxy-3-propenylphenyl)hexafluoropropane,
2,2-bis(4-hydroxy-3,5-dimethylphenyl) hexafluoropropane,
2,2-bis(4-hydroxyphenyl)propane,
2,2-bis(4-hydroxy-3-methylphenyl)propane,
2,2-bis(4-hydroxy-3-propenylphenyl)propane,
2,2-bis(4-hydroxy-3,5-dimethylphenyl)propane,
2,2-bis(4-hydroxy-3-fluorophenyl)propane,
2,2-bis(4-hydroxy-3,5-difluorophenyl)propane,
2,2-bis(4-chlorophenyl)hexafluoropropane,
bis(4-chlorophenyl)methane,
bis(4-chlorophenyl)diphenylmethane,
2,2-bis(4-chloro-3-methylphenyl)hexafluoropropane,
2,2-bis(4-chloro-3-propenylphenyl)hexafluoropropane,
2,2-bis(4-chloro-3,5-dimethylphenyl)hexafluoropropane,
2,2-bis(4-chlorophenyl)propane,
2,2-bis(4-chloro-3-methylphenyl)propane,
2,2-bis(4-chloro-3-propenylphenyl)propane,
2,2-bis(4-chloro-3,5-dimethylphenyl)propane,
2,2-bis(4-chloro-3-fluorophenyl)propane,
2,2-bis(4-chloro-3,5-difluorophenyl)propane,
2,2-bis(4-chlorophenyl)hexafluoropropane,
bis(4-bromophenyl)methane,
bis(4-bromophenyl)diphenylmethane, 2,2-bis(4-bromo-3-methylphenyl)hexafluoropropane,
2,2-bis(4-bromo-3-propenylphenyl)hexafluoropropane,
2,2-bis(4-bromo-3,5-dimethylphenyl)hexafluoropropane,
2,2-bis(4-bromophenyl)propane,
2,2-bis(4-bromo-3-methylphenyl)propane,
2,2-bis(4-bromo-3-propenylphenyl)propane,
2,2-bis(4-bromo-3,5-dimethylphenyl)propane,
2,2-bis(4-bromo-3-fluorophenyl)propane,
2,2-bis(4-bromo-3,5-difluorophenyl)propane,
bis(4-fluorophenyl)methane
bis(4-fluorophenyl)diphenylmethane,
2,2-bis(4-fluoro-3-methylphenyl)hexafluoropropane,
2,2-bis(4-fluoro-3-propenylphenyl)hexafluoropropane,
2,2-bis(4-fluoro-3,5-dimethylphenyl)hexafluoropropane,
2,2-bis(4-fluorophenyl)propane,
2,2-bis(4-fluoro-3-methylphenyl)propane,
2,2-bis(4-fluoro-3-propenylphenyl)propane,
2,2-bis(4-fluoro-3,5-dimethylphenyl)propane,
2,2-bis(4-fluoro-3-fluorophenyl)propane, and
2,2-bis(4-fluoro-3,5-difluorophenyl)propane.

Of the compounds enumerated above, the compounds having hydroxyl groups may be used after having been reacted with a basic compound containing sodium, potassium, or the like to convert the hydroxyl groups into —OM groups (wherein M is an alkali metal).

In the invention, two or more compounds represented by the formula (15) may be copolymerized.

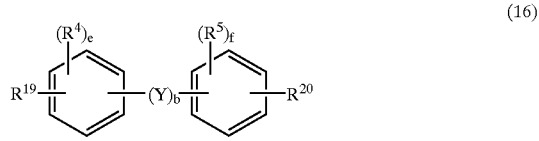

(16)

In the formula (16), $R^4$ and $R^5$ each independently represent a hydrocarbon group having 1 to 20 carbon atoms, a cyano group, a nitro group, an alkoxyl group having 1 to 20 carbon atoms, an aryl group, or a halogen atom; $R^{19}$ and $R^{20}$ each represent at least one member selected from the group consisting of a hydroxyl group, a halogen atom, and an —OM group (wherein M is an alkali meal); Y is at least one member selected from the group consisting of —O—, —CH$_2$—, —CO—, —COO—, —CONH—, —S—, —SO$_2$—, and a phenylene group; b is 0 or 1; and e and f each are an integer of 0 to 4.

Examples of the compound represented by the formula (16) include
4,4'-dichlorobiphenyl, 4,4'-dibromobiphenyl,
4,4'-difluorobiphenyl, 4,4'-diiodobiphenyl,
4,4'-dihydroxybiphenyl,
4,4'-dihydroxy-3,3'-dipropenylbiphenyl,
4,4'-dihydroxy-3,3'-dimethylbiphenyl,
4,4'-dihydroxy-3,3'-diethylbiphenyl,
4,4'-dimethylhydroxy-3,3',5,5'-tetrafluorobiphenyl,
4,4'-dibromooctafluorobiphenyl,
4,4'-dihydroxyoctafluorobiphenyl,
3,3'-diallyl-4,4'-bis(4-hydroxy)biphenyl,
4,4'-dichloro-2,2'-trifluoromethylbiphenyl,
4,4'-dibromo-2,2'-trifluoromethylbiphenyl,
4,4'-diiodo-2,2'-trifluoromethylbiphenyl,
bis(4-chlorophenyl)sulfone, bis(4-hydroxyphenyl)sulfone,
bis(4-chlorophenyl)ether, bis(4-hydroxyphenyl)ether,
4,4'-dichlorobenzophenone,
4,4'-dihydroxybenzophenone,
2,4-dichlorobenzophene, and
2,4-dihydroxybenzophenone.

Of the compounds enumerated above, the compounds having hydroxyl groups may be used after having been reacted with a basic compound containing sodium, potassium, or the like to convert the hydroxyl groups into —OM groups (wherein M is an alkali metal).

The compounds represented by the formula (16) may be used alone or in combination of two or more thereof.

(17)

In the formula (17), $R^6$ represents a hydrocarbon group having 1 to 20 carbon atoms, a cyano group, a nitro group, i an alkoxyl group having 1 to 20 carbon atoms, an aryl group, or a halogen atom; $R^{21}$ and $R^{22}$ each represent —OSO$_2$Z (wherein Z represents an alkyl group, a halogenoalkyl group, or an aryl group), a chlorine atom, a bromine atom, or an iodine atom; and g is an integer of 0 to 4.

Examples of the compound represented by the formula (17) include
1,2-dihydroxybenzene, 1,3-dihydroxybenzene, 1,4-dihydroxybenzene, 2,3-dihydroxytoluene, 2,5-dihydroxytoluene, 2,6-dihydroxytoluene, 3,4-dihydroxytoluene, 3,5-dihydroxytoluene, o-dichlorobenzene, o-dibromobenzene, o-diiodobenzene, o-dimethylsulfonyloxybenzene, 2,3-dichlorotoluene, 2,3-dibromotoluene, 2,3-diiodotoluene, 3,4-dichlorotoluene, 3,4-dibromotoluene, 3,4-diiodotoluene, 2,3-dimethylsulfonyloxybenzene, 3,4-dimethylsulfonyloxybenzene, m-dichlorobenzene, m-dibromobenzene, m-diiodobenzene, m-dimethylsulfonyloxybenzene, 2,4-dichlorotoluene, 2,4-dibromotoluene, 2,4-diiodotoluene, 3,5-dichlorotoluene, 3,5-dibromotoluene, 3,5-diiodotoluene, 2,6-dichlorotoluene, 2,6-dibromotoluene, 2,6-diiodotoluene, 3,5-dimethylsulfonyloxytoluene, 2,6-dimethylsulfonyloxytoluene, 2,4-dichlorobenzotrifluoride, 2,4-dibromobenzotrifluoride, 2,4-diiodobenzotrifluoride, 3,5-dichlorobenzotrifluoride, 3,5-dibromotrifluoride, 3,5-diiodobenzotrifluoride, 1,3-dibromo-2,4,5,6-tetrafluorobenzene, 2,4-dichlorobenzyl alcohol, 2,4-dibromobenzyl alcohol, 3,5-dichlorobenzyl alcohol, 3,5-dibromobenzyl alcohol, 3,5-dichlorophenol, 3,5-bibromophenol, 3,5-dichloro-t-butoxycarbonyloxyphenyl, 3,5-dibromo-t-butoxycarbonyloxyphenyl, 2,4-dichlorobenzoic acid, 3,5-dichlorobenzoic acid, 2,4-dibromobenzoic acid, 3,5-dibromobenzoic acid, methyl 2,4-dichlorobenzoate, methyl 3,5-dichlorobenzoate, methyl 3,5-dibromobenzoate, methyl 2,4-dibromobenzoate, t-butyl 2,4-dichlorobenzoate, t-butyl 3,5-dichlorobenzoate, t-butyl 2,4-dibromobenzoate, and t-butyl 3,5-dibromobenzoate.

Of the compounds enumerated above, the compounds having hydroxyl groups may be used after having been reacted with a basic compound containing sodium, potassium, or the like to convert the hydroxyl groups into —OM groups (wherein M is an alkali metal).

The compounds represented by the formula (17) may be used alone or in combination of two or more thereof.

In polymer (2), which is represented by the formula (3), the repeating structural units are contained in such a proportion that in the formula (3), m is from 0 to 100% by mole and n is from 0 to 100% by mole (provided that m+n=100% by mole).

Polymer (2) can be synthesized, for example, by heating dihydroxy compounds having two hydroxyl groups and dihalogenated compounds in a solvent in the presence of an alkali metal compound.

The dihydroxy compounds and the dihalogenated compounds are used in such amounts that the proportion of the dihydroxy compounds is generally from 45 to 55% by mole, preferably from 48 to 52% by mole, and that of the dihalogenated compounds is generally from 55 to 45% by mole, preferably from 52 to 48% by mole. When the proportion of the dihydroxy compounds is lower than 45% by mole or exceeds 55% by mole, there are cases where the polymer thus yielded is less apt to have a high molecular weight and shows poor applicability in coating film formation.

Examples of the alkali metal compound for use in this synthesis include sodium hydroxide, potassium hydroxide, lithium hydroxide, sodium carbonate, potassium carbonate, lithium carbonate, sodium hydrogen carbonate, potassium hydrogen carbonate, lithium hydrogen carbonate, sodium hydride, potassium hydride, lithium hydride, sodium metal, potassium metal, and lithium metal.

Those alkali metal compounds may be used alone or in combination of two or more thereof.

The amount of the alkali metal compound to be used is generally from 100 to 400% by mole, preferably from 100 to 250% by mole, based on the dihydroxy compounds.

A promoter may be used for accelerating the reaction. Examples thereof include copper metal, cuprous chloride, cupric chloride, cuprous bromide, cupric bromide, cuprous iodide, cupric iodide, cuprous sulfate, cupric sulfate, cuprous acetate, cupric acetate, cuprous formate, and cupric formate.

The amount of the promoter to be used is generally from 1 to 50% by mole, preferably from 1 to 30% by mole, based on the dihydroxy compounds.

Examples of the solvent for use in the reaction include pyridine, quinoline, benzophenone, diphenyl ether, dialkoxybenzenes (the alkoxyl groups each have 1 to 4 carbon atoms), trialkoxybenzenes (the alkoxyl groups each have 1 to 4 carbon atoms), diphenyl sulfone, dimethyl sulfoxide, dimethyl sulfone, diethyl sulfoxide, diethyl sulfone, diisopropyl sulfone, tetrahydrofuran, tetrahydrothiophene, sulfolane, N-methyl-2-pyrrolidone, N-ethyl-2-pyrrolidone, dimethylimidazolidinone, γ-butyrolactone, dimethylformamide, and dimethylacetamide.

Those solvents may be used alone or in combination of two or more thereof.

In synthesizing polymer (2), the reaction concentration is generally from 2 to 50% by weight based on the monomers, and the reaction temperature is generally from 50 to 250° C.

For removing the metal salt generated in the polymer synthesis and the unreacted monomers, the resultant reaction mixture is preferably subjected to filtration, reprecipitation from a poor solvent for the polymer, and washing with an acid or alkaline aqueous solution.

Polymer (2), which is obtained by the method described above, has a weight average molecular weight as determined by GPC of generally from 500 to 500,000, preferably from 800 to 100,000.

Polymer (3):

Polymer (3) can be produced, for example, by polymerizing monomers comprising compounds represented by the following formulae (18) to (20) in the presence of a catalyst system.

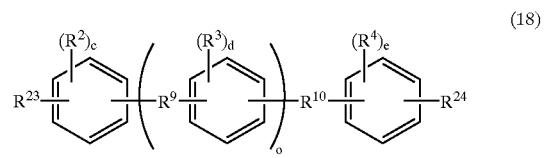

(18)

In the formula (18), $R^2$ to $R^4$ each independently represent a hydrocarbon group having 1 to 20 carbon atoms, a cyano group, a nitro group, an alkoxyl group having 1 to 20 carbon atoms, an aryl group, or a halogen atom; $R^9$ and $R^{10}$ each independently represent at least one member selected from the group consisting of —O—, —CH$_2$—, —CO—, —COO—, —CONH—, —S—, —SO$_2$—, and a phenylene group; $R^{23}$ and $R^{24}$ each independently represent a halogen atom; c to e each independently are an integer of 0 to 4; and o is an integer of 0 to 3.

Examples of the compound represented by the formula (18) include 4,4'-dibromodiphenyl ether, 4,4'-diiododiphenyl ether, 3,4'-dibromodiphenyl ether, 3,4'-diiododiphenyl ether, 2,4'-dibromodiphenyl ether, 2,4'-diiododiphenyl ether, 3,3'-dibromodiphenyl ether, 3,3'-diiododiphenyl ether, 2,2'-dibromodiphenyl ether, 2,2'-diiododiphenyl ether, 4,4'-dibromodiphenyl ketone, 4,4'-diiododiphenyl ketone, 3,4'-dibromodiphenyl ketone, 3,4'-diiododiphenyl ketone, 2,4'-dibromodiphenyl ketone, 2,4'-diiododiphenyl ketone, 3,3'-dibromodiphenyl ketone, 3,3'-diiododiphenyl ketone, 2,2'-dibromodiphenyl ketone, 2,2'-diiododiphenyl ketone, 1,2-bis(2-bromophenoxy)benzene, 1,2-bis(2-iodophenoxy)benzene, 1,2-bis(3-bromophenoxy)benzene, 1,2-bis(3-iodophenoxy)benzene, 1,2-bis(4-bromophenoxy)benzene, 1,2-bis(4-iodophenoxy)benzene, 1,3-bis(2-bromophenoxy)benzene, 1,3-bis(2-iodophenoxy)benzene, 1,3-bis(3-bromophenoxy)benzene, 1,3-bis(3-iodophenoxy)benzene, 1,3-bis(4-bromophenoxy)benzene, 1,3-bis(4-iodophenoxy)benzene, 1,4-bis(3-bromophenoxy)benzene, 1,4-bis(3-iodophenoxy)benzene, 1,4-bis(2-bromophenoxy)benzene, 1,4-bis(2-iodophenoxy)benzene, 1,4-bis(4-bromophenoxy)benzene, 1,4-bis(4-iodophenoxy)benzene, 1-(2-bromobenzoyl)-3-(2-bromophenoxy)benzene, 1-(2-iodobenzoyl)-3-(2-iodophenoxy)benzene, 1-(3-bromobenzoyl)-3-(3-bromophenoxy)benzene, 1-(3-iodobenzoyl)-3-(3-iodophenoxy)benzene, 1-(4-bromobenzoyl)-3-(4-bromophenoxy)benzene, 1-(4-iodobenzoyl)-3-(4-iodophenoxy)benzene, 1-(3-bromobenzoyl)-4-(3-bromophenoxy)benzene, 1-(3-iodobenzoyl)-4-(3-iodophenoxy)benzene, 1-(4-bromobenzoyl)-4-(4-bromophenoxy)benzene, 1-(4-iodobenzoyl)-4-(4-iodophenoxy)benzene, 2,2'-bis(2-bromophenoxy)benzophenone, 2,2'-bis(2-iodophenoxy)benzophenone, 2,4'-bis(2-bromophenoxy)benzophenone, 2,4'-bis(2-iodophenoxy)benzophenone, 4,4'-bis(2-bromophenoxy)benzophenone, 4,4'-bis(2-iodophenoxy)benzophenone, 2,2'-bis(3-bromophenoxy)benzophenone, 2,2'-bis(3-iodophenoxy)benzophenone, 2,4'-bis(3-bromophenoxy)benzophenone, 2,4'-bis(3-iodophenoxy)benzophenone, 4,4'-bis(3-bromophenoxy)benzophenone, 4,4'-bis(3-iodophenoxy)benzophenone, 2,2'-bis(4-bromophenoxy)benzophenone, 2,2'-bis(4-iodophenoxy)benzophenone, 2,4'-bis(4-bromophenoxy)benzophenone, 2,4'-bis(4-iodophenoxy)benzophenone, 4,4'-bis(4-bromophenoxy)benzophenone, 4,4'-bis(4-iodophenoxy)benzophenone, 2,2'-bis(2-bromobenzoyl)benzophenone, 2,2'-bis(2-iodobenzoyl)benzophenone, 2,4'-bis(2- bromobenzoyl)benzophenone, 2,4'-bis(2-iodobenzoyl) benzophenone, 4,4'-bis(2-bromobenzoyl)benzophenone, 4,4'-bis(2-iodobenzoyl)benzophenone, 2,2'-bis(3-bromobenozyl)benzophenone, 2,2'-bis(3-iodobenzoyl) benzophenone, 2,4'-bis(3-bromobenzoyl)benzophenone, 2,4'-bis(3-iodobenzoyl)benzophenone, 4,4'-bis(3-bromobenzoyl)benzophenone, 4,4'-bis(3-iodobenzoyl) benzophenone, 2,2'-bis(4-bromobenozyl)benzophenone, 2,2'-bis(4-iodobenzoyl)benzophenone, 2,4'-bis(4-bromobenzoyl)benzophenone, 2,4'-bis(4-iodobenzoyl) benzophenone, 4,4'-bis(4-bromobenzoyl)benzophenone, 4,4'-bis(4-iodobenzoyl)benzophenone, 3,4'-bis(2-bromophenoxy)diphenyl ether, 3,4'-bis(2-iodophenoxy) diphenyl ether, 3,4'-bis(3-bromophenoxy)diphenyl ether, 3,4'-bis(3-iodophenoxy) diphenyl ether, 3,4'-bis(4-bromophenoxy)diphenyl ether, 3,4'-bis(4-iodophenoxy) diphenyl ether, 4,4'-bis(2-bromophenoxy)diphenyl ether, 4,4'-bis(2-iodophenoxy)diphenyl ether, 4,4'-bis(3-bromophenoxy)diphenyl ether, 4,4'-bis(3-iodophenoxy) diphenyl ether, 4,4'-bis(4-bromophenoxy)diphenyl ether, 4,4'-bis(4-iodophenoxy)diphenyl ether, 3,4'-bis(2-bromobenzoyl)diphenyl ether, 3,4'-bis(2-iodobenzoyl) diphenyl ether, 3,4'-bis(3-bromobenzoyl)diphenyl ether, 3,4'-bis(3-iodobenzoyl)diphenyl ether, 3,4'-bis(4-bromobenzoyl)diphenyl ether, 3,4'-bis(4-iodobenzoyl) diphenyl ether, 4,4'-bis(2-bromobenzoyl)diphenyl ether, 4,4'-bis(2-iodobenzoyl)diphenyl ether, 4,4'-bis(3-bromobenzoyl)diphenyl ether, 4,4'-bis(3-iodobenzoyl) diphenyl ether, 4,4'-bis(4-bromobenzoyl)diphenyl ether, and 4,4'-bis(4-iodobenzoyl)diphenyl ether.

The compounds represented by the formula (18) may be used alone or in combination of two or more thereof.

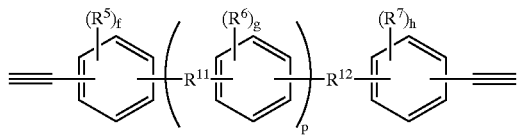

(19)

In the formula (19), $R^5$ to $R^7$ each independently represent a hydrocarbon group having 1 to 20 carbon atoms, a cyano group, a nitro group, an alkoxyl group having 1 to 20 carbon atoms, an aryl group, or a halogen atom; $R^{11}$ and $R^{12}$ each independently represent at least one member selected from the group consisting of —O—, —CH$_2$—, —CO—, —COO—, —CONH—, —S—, —SO$_2$—, and a phenylene group; f to h each independently are an integer of 0 to 4; and p is an integer of 0 to 3.

Examples of the compound represented by the formula (19) include
4,4'-diethynylbiphenyl, 3,3'-diethynylbiphenyl, 3,4'-diethynylbiphenyl, 4,4'-diethynyldiphenyl ether, 3,3'-diethynyldiphenyl ether, 3,4'-diethynyldiphenyl ether, 4,4'-diethynylbenzophenone, 3,3'-diethynylbenzophenone, 3,4'-diethynylbenzophenone, 4,4'-diethynyldiphenylmethane, 3,3'-diethynyldiphenylmethane, 3,4'-diethynyldiphenylmethane, 4,4'-diethynylbenzoic acid phenyl ester, 3,3'-diethynylbenzoic acid phenyl ester, 3,4'-diethynylbenzoic acid phenyl ester, 4,4'-diethynylbenzanilide, 3,3-diethynylbenzanilide, 3,4'-diethynylbenzanilide, 4,4'-diethynyldiphenyl sulfide, 3,3'-diethynyldiphenyl sulfide, 3,4'-diethynyldiphenyl sulfide, 4,4'-diethynyldiphenyl sulfone, 3,3'-diethynyldiphenyl sulfone, 3,4'-diethynyldiphenyl sulfone, 2, 4, 4'-triethynyldiphenyl ether, 9,9-bis(4-ethynylphenyl) fluorene, 4,4"-diethynyl-p-terphenyl, 4,4"-diethynyl-m-terphenyl, and 4,4"-diethynyl-o-terphenyl.

The compounds represented by the formula (19) may be used alone or in combination of two or more thereof.

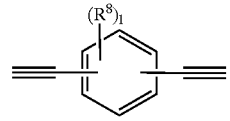

(20)

In the formula (20), $R^8$ represents a hydrocarbon group having 1 to 20 carbon atoms, a cyano group, a nitro group, an alkoxyl group having 1 to 20 carbon atoms, an aryl group, or a halogen atom; and i is an integer of 0 to 4.

Examples of the compound represented by the formula (20) include
1,2-diethynylbenzene, 1,3-diethynylbenzene, 1,4-diethynylbenzene, 2,5-diethynyltoluene, and 3,4-diethynyltoluene.

The compounds represented by the formula (20) may be used alone or in combination of two or more thereof.

Polymer (3) can be synthesized, for example, by polymerizing a compound represented by the formula (18) with both or either of a compound represented by the formula (19) and a compound represented by the formula (20) in the presence of a catalyst.

The compound represented by the formula (18) and both or either of the compound represented by the formula (19) and the compound represented by the formula (20) are used in such a proportion that the sum of the compound represented by the formula (19) and the compound represented by the formula (20) is generally from 0.8 to 1.2 mol, preferably from 0.9 to 1.1 mol, more preferably from 0.95 to 1.05 mol, per mol of the compound represented by the formula (18). In case where the sum of the compound represented by the formula (19) and the compound represented by the formula (20) is less than 0.8 mol or exceeds 1.2 mol, the polymer (3) obtained is less apt to have a sufficiently high molecular weight.

The polymerization for producing polymer (3) is preferably conducted in the presence of a catalyst system containing a transition metal compound, more preferably in the presence of the catalyst system which will be described below, which comprises a combination of a palladium catalyst containing a palladium compound and a basic compound.

The catalyst system preferred for use in the polymerization comprises a transition metal compound and a basic compound. This catalyst is preferably constituted of the following ingredients:

1) either a combination of a palladium salt and one or more ligands or palladium having one or more ligands coordinated thereto or a salt of these optionally containing one or more ligands; and 2) a compound of univalent copper.

Examples of the palladium salt include palladium chloride, palladium bromide, and palladium iodide. Examples of the ligands include triphenylphosphine, tri-o-tolylphosphine, tricyanophenylphosphine, and tricyanomethylphosphine. Preferred of these is triphenylphosphine.

Those compounds may be used alone or in combination of two or more thereof.

Examples of the palladium (salt) having one or more ligands coordinated thereto include dichlorobis (triphenylphosphine)palladium, dibromobis (triphenylphosphine)palladium, diiodobis (triphenylphosphine)palladium, dichlorobis(tri-o-tolylphosphine)palladium, dichlorobis (tricyanophenylphosphine)palladium, dichlorobis (tricyanomethylphosphine)palladium, dibromobis(tri-o-tolylphosphine)palladium, dibromobis (tricyanophenylphosphine)palladium, dibromobis (tricyanomethylphosphine)palladium, diiodobis(tri-o-tolylphosphine)palladium, diiodobis (tricyanophenylphosphine)palladium, diiodobis (tricyanomethylphosphine)palladium, tetrakis (triphenylphosphine)palladium, tetrakis(tri-o-tolylphosphine)palladium, tetrakis (tricyanophenylphosphine)palladium, and tetrakis (tricyanomethylphosphine)palladium. Preferred of these are dichlorobis(triphenylphosphine)palladium and tetrakis (triphenylphosphine)palladium.

Those compounds may be used alone or in combination of two or more thereof.

Examples of the compound of univalent copper include copper(I) chloride, copper(I) bromide, and copper(I) iodide.

Those compounds may be used alone or in combination of two or more thereof.

The catalyst components described above are used in the following proportions.

The proportion of the palladium salt to be used is preferably from 0.0001 to 10 mol, more preferably from 0.001 to 1 mol, per mol of all the compounds represented by the formulae (18) to (20). When the proportion thereof is smaller than 0.0001 mol, there are cases where the polymerization does not proceed sufficiently. On the other hand, proportions thereof exceeding 10 mol may result in difficulties in purification.

The proportion of the ligands to be used is preferably from 0.0004 to 50 mol, more preferably from 0.004 to 5 mol, per mol of all the compounds represented by the formulae (18) to (20). When the proportion thereof is smaller than 0.0004 mol, there are cases where the polymerization does not proceed sufficiently. On the other hand, proportions thereof exceeding 50 mol may result in difficulties in purification.

The proportion of the palladium (salt) having one or more ligands coordinated thereto is preferably from 0.0001 to 10 mol, more preferably from 0.001 to 1 mol, per mol of all the compounds represented by the formulae (18) to (20). When the proportion thereof is smaller than 0.0001 mol, there are cases where the polymerization does not proceed sufficiently. On the other hand, proportions thereof exceeding 10 mol may result in difficulties in purification.

The proportion of the compound of univalent copper to be used is preferably from 0.0001 to 10 mol, more preferably from 0.001 to 1 mol, per mol of all the compounds represented by the formulae (18) to (20). When the proportion thereof is smaller than 0.0001 mol. there are cases where the polymerization does not proceed sufficiently. On the other hand, proportions thereof exceeding 10 mol may result in difficulties in purification.

On the other hand, examples of the basic compound include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, diethylamine, ammonia, n-butylamine, and imidazole. Preferred of these are diethylamine, piperadine, and n-butylamine.

Those compounds may be used alone or in combination of two or more thereof.

The proportion of the base to be used is preferably from 1 to 1,000 mol, more preferably from 1 to 100 mol, per mol of all the compounds represented by the formulae (18) to (20). When the proportion thereof is smaller than 1 mol, there are cases where the polymerization does not proceed sufficiently. On the other hand, proportions thereof exceeding 100 mol are uneconomical.

In producing polymer (3), a solvent can be used according to need. The polymerization solvent is not particularly limited. Examples thereof include halogenated solvents such as chloroform, dichloromethane, 1,2-dichloroethane, chlorobenzene, and dichlorobenzene; aromatic hydrocarbon solvents such as benzene, toluene, xylene, mesitylene, and diethylbenzene; ether solvents such as diethyl ether, tetrahydrofuran, dioxane, diglyme, anisole, diethylene glycol dimethyl ether, diethylene glycol diethyl ether, and diethylene glycol methyl ethyl ether; ketone solvents such as acetone, methyl ethyl ketone, 2-heptpanone, cyclohexanone, and cyclopentanone; ester solvents such as methyl acetate, ethyl acetate, propyl acetate, butyl acetate, methyl lactate, ethyl lactate, butyl lactate, and γ-butyrolactone; and amide solvents such as N,N-dimethylformamide, N,N-dimethylacetamide, and N-methyl-2-pyrrolidone. It is preferred to sufficiently dry and deoxidize these solvents before use.

Those compounds may be used alone or in combination of two or more thereof.

The concentration of the monomers (polymerizable ingredients) in the polymerization solvent is preferably from 1 to 80% by weight, more preferably from 5 to 60% by weight.

Ingredient (B)

Ingredient (B) is a polymer having repeating structural units represented by the formula (1) described hereinabove.

Examples of the compound represented by the formula (1) include
polyvinylmethoxysiloxane, polyvinylethoxysiloxane, polyvinylisopropoxysiloxane, polyvinyl-n-propoxysiloxane, polyvinyl-n-butoxysiloxane, polyvinylisobutoxysiloxane, and polyvinyl-t-butoxysiloxane.

The number of the repeating units, which is indicated by a, is from 2 to 1,000, preferably from 3 to 500, more preferably from 5 to 500.

The compounds represented by the formula (1) can be used alone or in combination of two or more thereof.

Organic Solvent (C)

The composition for film formation of the invention is prepared by dissolving or dispersing ingredient (A) and ingredient (B) in an organic solvent (C).

Examples of the organic solvent (C) for use in the invention include aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene, n-amylnaphthalene, and trimethylbenzene; monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerol; ketone solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, 2-hexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone.

Those solvents may be used alone or in combination of two or more thereof.

Other Additives

Ingredients such as colloidal silica, colloidal alumina, organic polymers, surfactants, triazene compounds, radical generators, compounds having one or more reactive double bonds, and compounds having one or more reactive triple bonds may be added to the composition for film formation obtained in the invention.

The colloidal silica is a dispersion comprising, for example, any of the aforementioned hydrophilic organic solvents and high purity silicic acid anhydride dispersed therein. It has an average particle diameter of generally from 5 to 30 nm, preferably from 10 to 20 nm, and a solid concentration of generally about from 10 to 40% by weight. Examples of the colloidal silica include the methanol silica sol and isopropanol silica sol manufactured by Nissan Chemical Industries, Ltd. and Oscal, manufactured by Catalysts & Chemicals Industries Co., Ltd.

Examples of the colloidal alumina include Alumina Sol 520, 100, and 200, manufactured by Nissan Chemical Industries, Ltd., and Alumina Clear Sol and Alumina Sol 10 and 132, manufactured by Kawaken Fine Chemicals Co., Ltd.

Examples of the organic polymers include compounds having a sugar chain structure, vinyl amide polymers, (meth) acrylic polymers, aromatic vinyl compounds, dendrimers, polyimides, poly(amic acid)s, polyamides, polyquinoxaline, polyoxadiazole, fluoropolymers, and compounds having a poly(alkylene oxide) structure.

Examples of the compounds having a poly(alkylene oxide) structure include compounds having a poly(methylene oxide) structure, poly(ethylene oxide) structure, poly(propylene oxide) structure, poly(tetramethylene oxide) structure, poly(butylene oxide) structure, or the like.

Specific examples thereof include ether type compounds such as polyoxymethylene alkyl ethers, polyoxyethylene alkyl ethers, polyoxyethylene alkylphenyl ethers, polyoxyethylene sterol ethers, polyoxyethylene lanolin derivatives, ethylene oxide derivatives of alkylphenol formalin condensates, polyoxyethylene/polyoxypropylene block copolymers, and polyoxyethylene/polyoxypropylene alkyl ethers; ether-ester type compounds such as polyoxyethylene glycerol fatty acid esters, polyoxyethylene sorbitan fatty acid esters, polyoxyethylene sorbitol fatty acid esters, and polyoxyethylene fatty acid alkanolamide sulfuric acid salts; and ether-ester type compounds such as polyethylene glycol fatty acid esters, ethylene glycol fatty acid esters, fatty acid monoglycerides, polyglycerol fatty acid esters, sorbitan fatty acid esters, propylene glycol fatty acid esters, and sucrose fatty acid esters.

Examples of the polyoxyethylene/polyoxypropylene block copolymers include compounds having either of the following block structures:

—(X')$_p$—(Y')$_q$—

—(X')$_p$—(Y')$_q$—(X')$_r$— wherein X' represents —CH$_2$CH$_2$O—; Y' represents —CH$_2$CH(CH$_3$)O—; p is a number of 1 to 90; q is a number of 10 to 99; and r is a number of 0 to 90.

More preferred of those compounds enumerated above are ether type compounds such as polyoxyethylene alkyl ethers, polyoxyethylene/polyoxypropylene block copolymers, polyoxyethylene/polyoxypropylene alkyl ethers, polyoxyethylene glycerol fatty acid esters, polyoxyethylene sorbitan fatty acid esters, and polyoxyethylene sorbitol fatty acid esters.

Those compounds may be used alone or in combination of two or more thereof.

Examples of the surfactants include nonionic surfactants, anionic surfactants, cationic surfactants, and amphoteric surfactants, and further include fluorochemical surfactants, silicone surfactants, poly(alkylene oxide) surfactants, and poly(meth)acrylate surfactants. Preferred of these are fluorochemical surfactants and silicone surfactants.

The fluorochemical surfactants are ones comprising a compound having a fluoroalkyl or fluoroalkylene group in at least one position selected from the ends, main chain, and side chains. Examples thereof include 1,1,2,2-tetrafluorooctyl 1,1,2,2-tetrafluoropropyl ether, 1,1,2,2-tetrafluorooctyl hexyl ether, octaethylene glycol di(1,1,2,2-tetrafluorobutyl)ether, hexaethylene glycol 1,1,2,2,3,3-hexafluoropentylether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, N-[3-perfluorooctanesulfonamido)propyl]-N,N'-dimethyl-N-carboxymethyleneammonium betaine, perfluoroalkylsulfonamidopropyltrimethylammonium salts, perfluoroalkyl-N-ethylsulfonyl glycine salts, bis(N-perfluorooctylsulfonyl-N-ethylaminoethyl)phosphate, and monoperfluoroalkylethyl phosphates.

Commercially available products of such fluorochemical surfactants include products available under the trade names of Megafac F142D, F172, F173, and F183 (manufactured by Dainippon Ink & Chemicals, Inc.); F-Top EF301, EF303, and EF352 (manufactured by New Akita Chemical Company); Fluorad FC-430 and FC-431 (manufactured by Sumitomo 3M Ltd.); Asahi Guard AG710 and Surflon S-382, SC-101, SC-102, SC-103, SC-104, SC-105, and SC-106 (manufactured by Asahi Glass Co., Ltd.); BM-1000 and BM-1100 (manufactured by Yusho K.K.); and NBX-15 (manufactured by NEOS Co., Ltd.). Especially preferred of these are Megafac F172, BM-1000, BM-1100, and NBX-15.

Examples of the silicone surfactants include SH7PA, SH21PA, SH30PA, and ST94PA (all manufactured by Dow Corning Toray Silicone Co., Ltd.). Especially preferred of these are SH28PA and SH30PA.

The amount of such a surfactant to be used is usually from 0.00001 to 1 part by weight per 100 parts by weight of ingredient (A).

Those surfactants may be used alone or in combination of two or more thereof.

Examples of the triazene compounds include 1,2-bis(3,3-dimethyltriazenyl)benzene, 1,3-bis(3,3-dimethyltriazenyl)benzene, 1,4-bis(3,3-dimethyltriazenyl)benzene, bis(3,3-dimethyltriazenylphenyl)ether, bis(3,3-dimethyltriazenylphenyl)methane, bis(3,3-dimethyltriazenylphenyl)sulfone, bis(3,3-dimethyltriazenylphenyl)sulfide, 2,2-bis[4-(3,3-dimethyltriazenylphenoxy)phenyl]-1,1,1,3,3,3-hexafluoropropane, 2,2-bis[4-(3,3-dimethyltriazenylphenoxy)phenyl]propane, 1,3,5-tris(3,3-dimethyltriazenyl)benzene, 2,7-bis(3,3-dimethyltriazenyl)-9,9-bis[4-(3,3-dimethyltriazenyl)phenyl]fluorene, 2,7-bis(3,3-dimethyltriazenyl)-9,9-bis[3-methyl-4-(3,3-dimethyltriazenyl)phenyl]fluorene, 2,7-bis(3,3-dimethyltriazenyl)-9,9-bis[3-phenyl-4-(3,3-dimethyltriazenyl)phenyl]fluorene, 2,7-bis(3,3-dimethyltriazenyl)-9,9-bis[3-propenyl-4-(3,3-dimethyltriazenyl)phenyl]fluorene, 2,7-bis(3,3-dimethyltriazenyl)-9,9-bis[3-fluoro-4-(3,3-dimethyltriazenyl)phenyl]fluorene, 2,7-bis(3,3-dimethyltriazenyl)-9,9-bis[3,5-difluoro-4-(3,3-dimethyltriazenyl)phenyl]fluorene, and 2,7-bis(3,3-dimethyltriazenyl)-9,9-bis[3-trifluoromethyl-4-(3,3-dimethyltriazenyl)phenyl]fluorene.

Those triazene compounds may be used alone or in combination of two or more thereof.

Examples of the radical generators include isobutyryl peroxide, α,α'-bis(neodecanoylperoxy)diisopropylbenzene, cumyl peroxyneodecanoate, di-n-propyl peroxydicarbonate, diisopropyl peroxydicarbonate, 1,1,3,3-tetramethylbutyl peroxyneodecanoate, bis(4-t-butylcyclohexyl) peroxydicarbonate, 1-cyclohexyl-1-methylethyl peroxyneodecanoate, di-2-ethoxyethyl peroxydicarbonate, di-2-ethylhexyl peroxydicarbonate, t-hexyl peroxyneodecanoate, dimethoxybutyl peroxydicarbonate, di(3-methyl-3-methoxybutyl)peroxydicarbonate, t-butyl peroxyneodecanoate, 2,4-dichlorobenzoyl peroxide, t-hexyl peroxypivalate, t-butyl peroxypivalate, 3,5,5-trimethylhexanoyl peroxide, octanoyl peroxide, lauroyl peroxide, stearoyl peroxide, 1,1,3,3-tetramethylbutyl peroxy-2-ethylhexanoate, succinic peroxide, 2,5-dimethyl-2,5-di(2-ethylhexanoylperoxy)hexane, 1-cyclohexyl-1-methylethyl peroxy-2-ethylhexanoate, t-hexyl peroxy-2-ethylhexanoate, t-butyl peroxy-2-ethylhexanoate, m-toluoyl benzoyl peroxide, benzoyl peroxide, t-butyl peroxyisobutyrate, di-t-butylperoxy-2-methylcyclohexane, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclodecane, t-hexyl peroxyisopropylmonocarbonate, t-butyl peroxymaleate, t-butyl peroxy-3,3,5-trimethylhexanoate, t-butyl peroxylaurate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, 2,5-dimethyl-2,5-di(benzoylperoxy)hexane, t-butyl peroxyacetate, 2,2-bis(t-butylperoxy)butane, t-butyl peroxybenzoate, n-butyl 4,4-bis(t-butylperoxy)valerate, di-t-butyl peroxyisophthalate, α,α'-bis(t-butylperoxy)diisopropylbenzene, dicumyl peroxide, 2,5-dimethyl-2,5-di(t-butylperoxy)hexane, t-butylcumyl peroxide, di-t-butyl peroxide, p-menthane hydroperoxide, 2,5-dimethyl-2,5-di(t-butylperoxy)hexyne-3, diisopropylbenzene hydroperoxide, t-butyl trimethylsilyl peroxide, 1,1,3,3-tetramethylbutyl hydroperoxide, cumene hydroperoxide, t-hexyl hydroperoxide, t-butyl hydroperoxide, dibenzyl, 2,3-dimethyl-2,3-diphenylbutane, α,α'-dimethoxy-α,α'-diphenylbibenzyl, α,α'-diphenyl-α-methoxybibenzyl, α,α'-diphenyl-α,α'-dimethoxybibenzyl, α,α'-dimethoxy-α,α'-dimethylbibenzyl, α,α'-dimethoxybibenzyl, 3,4-dimethyl-3,4-diphenyl-n-hexane, and 2,2,3,3-tetraphenylsuccinonitrile.

Those radical generators may be used alone or in combination of two or more thereof.

Examples of the compounds having one or more reactive double bonds include allyl compounds such as allylbenzene, diallylbenzene, triallylbenzene, allyloxybenzene, diallyloxybenzene, triallyloxybenzene, α,ω-diallyloxyalkanes, α,ω-diallylalkenes, α,ω-diallylalkynes, allylamine, diallylamine, triallylamine, N-allylphthalimide, N-allylpyromellitimide, N,N'-diallylurea, triallyl isocyanurate, and 2,2'-diallylbisphenol A; vinyl compounds such as styrene, divinylbenzene, trivinylbenzene, stilbene, propenylbenzene, dipropenylbenzene, tripropenylbenzene, phenyl vinyl ketone, methyl styryl ketone, α,ω- divinylalkanes, α,ω-divinylalkenes, α,ω-divinylalkynes, α,ω-divinyloxyalkanes, α,ω-divinyloxyalkenes, α,ω-divinyloxyalkynes, α,ω-diacryloyloxyalkanes, α,ω-diacryloylalkenes, α,ω-diacryloylalkynes, α,ω-dimethacryloyloxyalkanes, α,ω-dimethacryloylalkenes, α,ω-dimethacryloylalkynes, bisacryloyloxybenzene, trisacryloyloxybenzene, bismethacryloyloxybenzene, trismethacryloyloxybenzene, N-vinylphthalimide, and N-vinylpyromellitimide; and poly(arylene ether)s containing 2,2'-diallyl-4,4'-biphenol and polyarylenes containing 2,2'-diallyl-4,4'-biphenol.

Those compounds having one or more reactive double bonds may be used alone or in combination of two or more thereof.

Examples of the compounds having one or more reactive triple bonds include ethynylbenzene, diethynylbenzene, triethynylbenzene, tolan trimethylsilylethynylbenzene, trimethylsilylethynylbenzene, bis(trimethylsilylethynyl)benzene, tris(trimethylsilylethynyl)benzene, phenylethynylbenzene, bis(phenylethynyl)benzene, tris(phenylethynyl)benzene, bis(ethynylphenyl) ether, bis(trimethylsilylethynylphenyl) ether, and bis(phenylethynylphenyl) ether.

Those compounds having one or more reactive triple bonds may be used alone or in combination of two or more thereof.

At least one member selected from the group consisting of the aforementioned radical generators, compounds having one or more reactive double bonds, and compounds having one or more reactive triple bonds maybe used in an amount of generally from 0.2 to 30 parts by weight, preferably from 0.5 to 25 parts by weight, per 100 parts by weight of ingredient (A) according to the invention. When the amount of the at least one member is smaller than 0.2 parts by weight, there are cases where the composition gives a coating film having poor heat resistance. On the other hand, amounts thereof exceeding 30 parts by weight may result in impaired applicability in coating film formation.

When at least one member selected from the group consisting of the radical generators, compounds having one or more reactive double bonds, and compounds having one or more reactive triple bonds is incorporated into the composition of the invention, the heat resistance of the coating film can be improved through crosslinking.

The composition for film formation of the invention has a total solid concentration of preferably from 2 to 30% by weight. The solid concentration thereof is suitably regulated according to the intended use thereof. When the composition has a total solid concentration of from 2 to 30% by weight, the composition not only gives a coating film having an appropriate thickness but has better storage stability.

For applying the composition of the invention to a substrate such as a silicon wafer, $SiO_2$ wafer, or SiN wafer, use may be made of a coating technique such as spin coating, dip coating, roll coating, or spraying.

This coating operation can be conducted so as to form a coating film having a thickness on a dry basis of about from 0.02 to 1.5 μm in the case of single coating or about from 0.04 to 3 μm in the case of double coating. Thereafter, the wet coating film may be dried at ordinary temperature or dried with heating at a temperature of about from 80 to 600° C. usually for about from 5 to 240 minutes. Thus, a coating film can be formed.

In this operation, heating can be conducted with a hot plate, oven, furnace, or the like, for example, in the air, in a nitrogen or argon atmosphere, under vacuum, or under reduced pressure having a controlled oxygen concentration.

Irradiation with electron beams or ultraviolet also can be used for forming a coating film.

The coating film (interlayer insulating film) thus obtained is excellent in heat resistance, low dielectric constant characteristics, cracking resistance, and adhesion to the substrate. Consequently, the composition of the invention is useful in applications such as interlayer insulating films, etching stopper films, CMP stopper films, or copper diffusion preventive films for semiconductor devices such as LSIs, system LSIs, DRAMs, SDRAMs, RDRAMs, and D-RDRAMs, protective films such as surface coat films for semiconductor devices, interlayers or antireflection films for use in semiconductor production processes employing a multilayered resist, interlayer insulating films for multilayered printed circuit boards, and protective or insulating films for liquid-crystal display devices.

The invention will be explained below in more detail by reference to the following Examples, but the invention should not be construed as being limited to these Examples.

In the following Examples and Comparative Examples, all "parts" and "percents" are by weight unless otherwise indicated.

The compositions for film formation were evaluated in the Examples by the following methods.

Weight Average Molecular Weight (Mw)

Measured by gel permeation chromatography (GPC) under the following conditions.

Sample: One gram of a polymer (product of hydrolysis and condensation) was dissolved in 100 cc of tetrahydrofuran as a solvent to prepare a sample solution.

Standard polystyrene: Standard polystyrene manufactured by Pressure Chemical, U.S.A. was used.

Apparatus: A high performance gel permeation chromatograph for high-temperature use (Model 150-C ALC/GPC) manufactured by Waters Inc., U.S.A.

Column: SHODEX A-80M (length, 50 cm), manufactured by Showa Denko K.K.

Measuring temperature: 40° C.

Flow rate: 1 cc/min.

Dielectric Constant of Coating Film

A composition sample was applied to an 8-inch silicon wafer by spin coating. The coated substrate was baked on a hot plate at 100° C. for 1 minute and then cured on a 430° C. hot plate in a nitrogen atmosphere for 9 minutes. Aluminum was vapor-deposited on the resultant coated substrate to produce a substrate for dielectric constant evaluation. This substrate was examined with electrodes HP16451B and precision LCR meter HP4284A, both manufactured by Yokogawa-Hewlett-Packard, Ltd., and the dielectric constant thereof was calculated from the capacitance value obtained at 10 kHz.

Cracking Resistance of Coating Film

A composition sample was applied to an 8-inch silicon wafer by spin coating. The coated substrate was baked on a hot plate at 100° C. for 1 minute and then cured on a 430° C. hot plate in a nitrogen atmosphere for 9 minutes. This coating operation was conducted so as to result in a final coating film thickness of 6 μm. The coated substrate obtained was immersed in 60° C. hot water for 2 hours, and the appearance of the coating film was examined with a 350,000-lx lamp for surface examination. Cracking resistance was evaluated based on the following criteria.

○: No cracks were observed in the coating film surface.

X: Cracks were observed in the coating film surface.

Modulus of Elasticity of Coating Film

A composition sample was applied to an 8-inch silicon wafer by spin coating. The coated substrate was baked on a hot plate at 100° C. for 1 minute and then cured on a 430° C. hot plate in a nitrogen atmosphere for 9 minutes. The film obtained was examined with Nano Indenter XP (manufactured by Nano Instruments Inc.) by a continuous method for rigidity measurement to determine the modulus of elasticity thereof.

Adhesion of Coating Film

A composition sample was applied by spin coating to an 8-inch silicon wafer having 1,000-Å SiC. The coated substrate was baked on a hot plate at 100° C. for 1 minute and then cured on a 430° C. hot plate in a nitrogen atmosphere for 12 minutes. This coated substrate was immersed in 60° C. hot water for 2 hours. Ten stud pins were fixed to the resultant coated substrate with an epoxy resin. After the epoxy resin applied was cured at 150° C. for 1 hour, the stud pins were pulled out by the Sebastian method to evaluate the adhesion of the coating film based on the following criteria.

○: No peeling occurred between the silicon wafer and the coating film with respect to each of the ten stud pins.

X: Peeling occurred between the silicon wafer and the coating film.

SYNTHESIS EXAMPLE 1

Into a three-necked flask were introduced 7.5 g of sodium iodide, 1.3 g of anhydrous nickel chloride, 15.7 g of triphenylphosphine, 19.6 g of a zinc powder activated with acetic acid, and 16.7 g of 9,9-bis(methylsulfonyloxy)fluorene. The contents were baked under vacuum for 24 hours. Thereafter, the atmosphere in the three-necked flask was filled with argon gas. Subsequently, 50 ml of dry N,N-dimethylacetamide, 50 ml of dry tetrahydrofuran, and 10.8 g of 2,4-dichlorotoluene were added to the contents, and the resultant mixture was stirred at 70° C. in an argon stream. As a result, the reaction mixture turned brown. This reaction mixture was further reacted at 70° C. for 20 hours and then poured into a mixture of 400 ml of 36% hydrochloric acid and 1,600 ml of methanol. The resultant precipitate was recovered.

The precipitate obtained was added to chloroform to obtain a suspension, which was extracted with 2 N aqueous hydrochloric acid solution. Thereafter, the chloroform layer was poured into methanol, and the resultant precipitate was recovered and baked. As a result, a polymer (1) having a weight average molecular weight of 10,300 was obtained as a white powder.

SYNTHESIS EXAMPLE 2

Into a 1 liter three-necked flask equipped with a nitrogen introduction tube and a Dean-Stark condenser were introduced 26.48 g of 9,9-bis(4-hydroxyphenyl)fluorene, 28.35 g of 9,9-bis(4-hydroxy-3-methylphenyl)fluorene, 45.60 g of anhydrous potassium carbonate, 500 ml of dimethylacetamide, and 150 ml of toluene. The resultant mixture was heated at 140° C. for 3 hours in a nitrogen atmosphere. After the water yielded by salt formation and the excess toluene were removed, the reaction mixture was cooled to room temperature. To the residual reaction mixture was added 32.73 g of 4,4'-difluorobenzophenone. This mixture was reacted at 165° C. for 10 hours. After cooling, the reaction mixture was poured into 5 liters of methanol containing 10% HCl to conduct reprecipitation. The resultant precipitate was taken out by filtration, sufficiently washed with ion-exchanged water, and then prebaked with a vacuum oven. This precipitate was redissolved in tetrahydrofuran, and the undissolved matter was removed. The solution was poured into methanol to conduct reprecipitation. This reprecipitation operation was repeated once. The polymer was thus purified and then baked in a vacuum oven at 80° C. for 12 hours. Thus, a polymer (2) having a weight average molecular weight of 150,000 was obtained as a white powder.

SYNTHESIS EXAMPLE 3

Into a 1,000 ml three-necked flask equipped with a thermometer, argon gas introduction tube, and stirrer were introduced 150 mL of diethylamine, 2.1 g of dichlorobistriphenylphosphinepalladium, 0.286 g of copper iodide, 600 mL of 1,2-dichloroethane, and 185.72 g of 4,4'-bis(2-iodophenoxy)benzophenone. Thereto was added 65.48 g of 4,4'-diethynyldiphenyl ether. The resultant mixture was reacted at 50° C. for 20 hours. This reaction mixture was repeatedly subjected twice to reprecipitation from 5 liters of acetic acid. The precipitate thus obtained was dissolved in chloroform, and this solution was washed with ultrapure water twice and then subjected to reprecipitation from 5 liters of cyclohexane. The resultant precipitate was taken out by filtration and baked to obtain a polymer (3) having a weight average molecular weight of 35,000.

COMPARATIVE SYNTHESIS EXAMPLE 1

In a separable flask made of quartz, 77.04 g of methyltrimethoxysilane, 24.05 g of tetramethoxysilane, and 0.48 g of acetic acid were dissolved in 290 g of propylene glycol monopropyl ether. This solution was stirred with a Three-One Motor to keep the temperature thereof at 60° C. Subsequently, 84 g of ion-exchanged water was added to the solution over 1 hour, and the resultant mixture was reacted at 60° C. for 2 hours. Thereafter, 25 g of acetylacetone was added thereto, and this reaction mixture was reacted for further 30 minutes and then cooled to room temperature. A liquid containing methanol and water was removed in an amount of 149 g from the reaction mixture by evaporation at 50° C. Thus, a reaction mixture (1) was obtained.

The product of hydrolysis and condensation thus obtained had a weight average molecular weight of 1,900.

EXAMPLE 1

In 18 g of cyclohexanone were dissolved 2 g of the polymer (1) obtained in Synthesis Example 1 and 0.05 g of polyvinylmethoxysiloxane having a weight average molecular weight of 500. This solution was filtered through a filter made of polytetrafluoroethylene (Teflon, manufactured by E. I. du Pont de Nemours & Co.) having an opening diameter of 0.2 μm to obtain a composition for film formation of the invention.

The composition obtained was applied to a silicon wafer by spin coating.

The coating film was examined for dielectric constant. As a result, the dielectric constant thereof was found to be 2.87, which is below 3. The coating film had excellent mechanical strength with a modulus of elasticity of 6.3 GPa. Even when immersed in water, the coating film did not crack. In adhesion evaluation, no peeling from the substrate occurred.

EXAMPLES 2 TO 6

The compositions shown in Table 1 were evaluated in the same manner as in Example 1.

TABLE 1

| Example | Ingredient (A) | Ingredient (B) | Ingredient (C) | Dielectric constant | Cracking resistance | Modulus of elasticity (GPa) | Adhesion |
|---|---|---|---|---|---|---|---|
| 1 | polymer (1) 2 g | polyvinylmethoxy-siloxane (weight average molecular weight, 500) 0.05 g | cyclohexanone 18 g | 2.87 | ○ | 6.3 | ○ |
| 2 | polymer (1) 2 g | polyvinylethoxy-siloxane (weight average molecular weight, 500) 0.05 g | cyclopentanone 18 g | 2.88 | ○ | 6.4 | ○ |
| 3 | polymer (2) 2 g | polyvinylethoxy-siloxane (weight average molecular weight, 500) 0.04 g | cyclohexanone 18 g | 2.92 | ○ | 7.3 | ○ |
| 4 | polymer (2) 2 g | polyvinylethoxy-siloxane (weight average molecular weight, 1,000) 0.04 g | cyclohexanone 18 g | 2.93 | ○ | 7.2 | ○ |
| 5 | polymer (3) 2 g | polyvinylmethoxy-siloxane (weight average molecular weight, 500) 0.05 g | cyclohexanone 18 g | 2.97 | ○ | 5.8 | ○ |
| 6 | polymer (3) 2 g | polyvinylmethoxy-siloxane (weight average molecular weight, 500) 0.01 g | cyclohexanone 18 g | 2.95 | ○ | 5.7 | ○ |

EXAMPLE 7

A solution was prepared and the coating film was evaluated in the same manner as in Example 1, except that 0.04 g of polyvinylmethoxysiloxane having a weight-average molecular weight of 500 was added to 100 g of a commercial poly(arylene ether) solution (trade name, SiLK I (manufactured by The Dow Chemical Co.)).

The coating film was examined for dielectric constant. As a result, the dielectric constant thereof was found to be 2.67, which is below 3. The coating film had excellent mechanical strength with a modulus of elasticity of 5.0 GPa. Even when immersed in water, the coating film did not crack. In adhesion evaluation, no peeling from the substrate occurred.

EXAMPLE 8

A solution was prepared and the coating film was evaluated in the same manner as in Example 1, except that 0.04 g of polyvinylethoxysiloxane having a weight average molecular weight of 1,500 was added to 100 g of a commercial poly(arylene ether) solution (trade name, FLARE 2.0 (manufactured by Honeywell Inc.)).

The coating film was examined for dielectric constant. As a result, the dielectric constant thereof was found to be 2.87, which is below 3. The coating film had excellent mechanical strength with a modulus of elasticity of 5.0 GPa. Even when immersed in water, the coating film did not crack. In adhesion evaluation, no peeling from the substrate occurred.

REFERENCE EXAMPLE 1

A coating film was formed and evaluated in the same manner as in Example 1, except that 2 g of the polymer (1) obtained in Synthesis Example 1 only was dissolved in 18 g of cyclohexanone.

The coating film had a dielectric constant of 2.88. In the evaluation of coating film adhesion, however, interfacial peeling form the substrate occurred with respect to six stud pull pins.

REFERENCE EXAMPLE 2

A coating film was formed and evaluated in the same manner as in Example 1, except that 2 g of the polymer (2) obtained in Synthesis Example 2 only was dissolved in 18 g of cyclohexanone.

The coating film had a dielectric constant of 2.93. In the evaluation of coating film adhesion, however, interfacial peeling form the substrate occurred with respect to five stud pull pins.

REFERENCE EXAMPLE 3

A coating film was formed and evaluated in the same manner as in Example 1, except that 2 g of the polymer (3) obtained in Synthesis Example 3 only was dissolved in 18 g of cyclohexanone.

The coating film had a dielectric constant of 2.98. In the evaluation of coating film adhesion, however, interfacial peeling form the substrate occurred with respect to eight stud pull pins.

REFERENCE EXAMPLE 4

A coating film was formed and evaluated in the same manner as in Example 1, except that a commercial poly (arylene ether) solution (trade name, SiLK I (manufactured by The Dow Chemical Co.)) only was used.

The coating film had a dielectric constant of 2.66. In the evaluation of coating film adhesion, however, interfacial peeling form the substrate occurred with respect to two stud pull pins.

REFERENCE EXAMPLE 5

A coating film was formed and evaluated in the same manner as in Example 1, except that a commercial poly (arylene ether) solution (trade name, FLARE 2.0 (manufactured by Honeywell Inc.)) only was used.

The coating film had a dielectric constant of 2.84. In the evaluation of coating film adhesion, however, interfacial peeling form the silicon wafer occurred with respect to three stud pull pins.

REFERENCE EXAMPLE 6

A coating film was formed and evaluated in the same manner as in Example 1, except that the reaction mixture (1) obtained in Comparative Synthesis Example 1 only was used.

The coating film had a dielectric constant of 3.23. In the evaluation of cracking resistance, the coating film developed many cracks.

According to the invention, a composition for film formation (material for interlayer insulating films) having an excellent balance among properties including low dielectric constant characteristics, cracking resistance, modulus of elasticity of coating, and adhesion to substrates can be provided by using, as components of the composition, (A) at least one member selected from the group consisting of an aromatic polyarylene and an aromatic poly (arylene ether), (B) a siloxane polymer having a specific structure, and (C) an organic solvent.

What is claimed is:

1. A composition for film formation which comprises (A) at least one member selected from the group consisting of an aromatic polyarylene and an aromatic poly (arylene ether), (B) a polymer having repeating structural units represented by the following formula (1), and (C) an organic solvent,

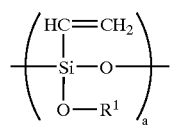
(1)

wherein $R^1$ represents a hydrocarbon group having 1 to 5 carbon atoms and a is an integer of 5 to 500.

2. The composition for film formation of claim 1, wherein ingredient (A) contains at least one member selected from the group consisting of alkyl groups having 1 to 20 carbon atoms, reactive double bonds, and reactive triple bonds.

3. The composition for film formation of claim 1, wherein ingredient (A) comprises a polymer having at least one member selected from the group consisting of repeating structural units represented by the following formulae (2) to (5):

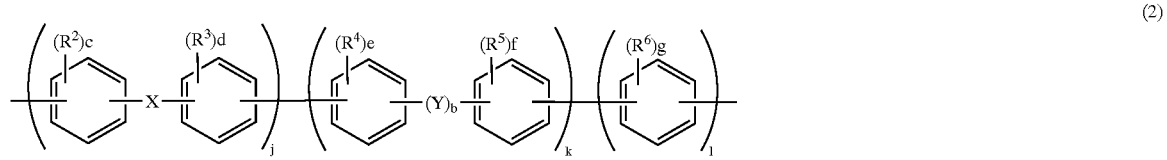
(2)

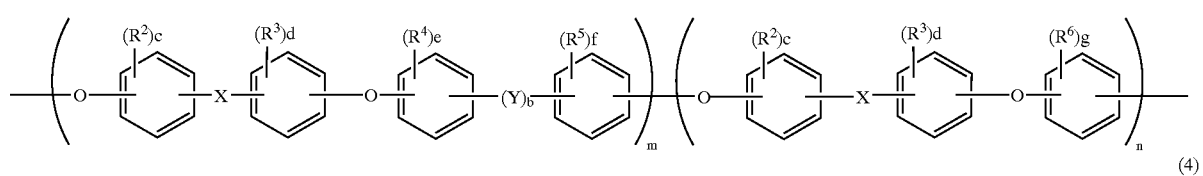
(3)

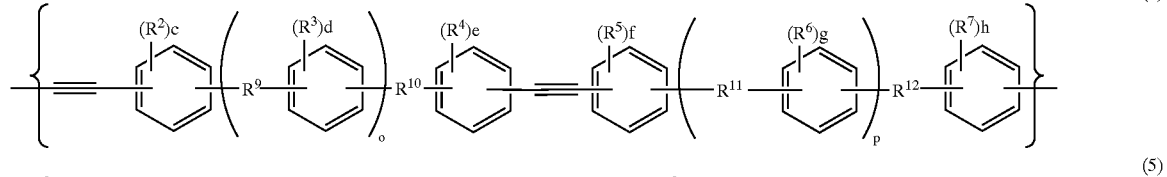
(4)

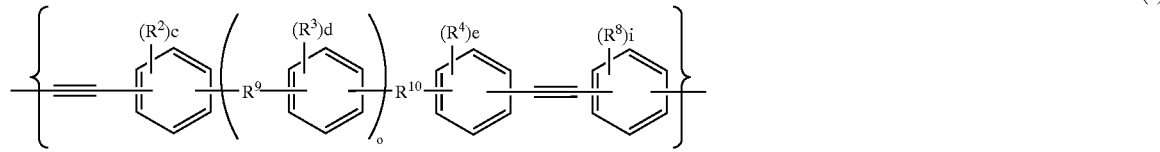
(5)

wherein $R^2$ to $R^8$ each independently represent a hydrocarbon group having 1 to 20 carbon atoms, a cyano group, a nitro group, an alkoxyl group having 1 to 20 carbon atoms, an aryl group, or a halogen atom; X is at least one member selected from the group consisting of groups represented by —CQQ'— (wherein Q and Q' may be the same or different and each represent a halogenoalkyl group, an alkyl group, a hydrogen atom, a halogen atom, or an aryl group) and a fluorenylene group; Y and $R^9$ and $R^{10}$ each independently are at least one member selected from the group consisting of —O—, —CH$_2$—, —CO—, —COO—, —CONH—, —S—, —SO$_2$—,

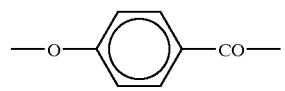

and a phenylene group; $R^{11}$ and $R^{12}$ each independently are at least one member selected from the group consisting of —O—, —CH$_2$—, —CO—, —COO—, —CONH—, —S—, —SO$_2$— and a phenylene group; b is 0 or 1, c to i each independently are an integer of 0 to 4; j is 5 to 100 mol %; k is 0 to 95 mol %; l is 0 to 95 mol % (provided that j+k+l=100 mol %); m is 0 to 100 mol %; n is 0 to 100 mol % (provided that m+n=100 mol %); o is an integer of 0 to 3; p is an integer of 0 to 3.

4. The composition for film formation of claim 1, wherein the proportion of ingredient (A) to ingredient (B) is such that the amount of ingredient (B) is from 0.001 to 10 parts by weight per 100 parts by weight of ingredient (A).

5. A material for insulating film formation which comprises the composition for film formation of claim 1.

6. The composition according to claim 1, wherein said polymer (B) is at least one member selected from group consisting of polyvinylmethoxysiloxane, polyvinylethoxysiloxane, polyvinylisopropoxysiloxane, polyvinyl-n-propoxysiloxane, polyvinyl-n-butoxysiloxane, polyvinylisobutoxysiloxane, and polyvinyl-t-butoxysiloxane.

7. The composition according to claim 1, further comprising
at least one member selected from the group consisting of colloidal silica, colloidal alumina, organic polymers, surfactants, triazene compounds, radical generators, compounds having one or more reactive double bonds, and compounds having one or more reactive triple bonds.

8. The composition according to claim 7, wherein an amount of said surfactant is from 0.00001 to 1 part by weight per 100 parts by weight of component (A).

9. The composition according to claim 7, in which at least one member selected from the group consisting of said radical generators, said compounds having one or more reactive double bonds, and said compounds having one or more reactive triple bonds is used in an amount of from 0.2 to 30 parts by weight per 100 parts by weight of component (A).

10. The composition according to claim 1, having a solid concentration of from 2 to 30% by weight.

11. A method of coating a substrate, comprising:
applying the composition according to claim 1 to a substrate by spin coating, dip coating, roll coating or spraying, to obtain a coating film on said substrate.

12. The method according to claim 11, wherein said coating film has a thickness on a dry basis of about from 0.02 to 1.5 μm for a single coating.

13. The method according to claim 11, wherein a thickness of said coating film on a dry basis is about 0.04 to 3 μm for a double coating.

14. The method according to claim 11, further comprising:
drying said coating film at a temperature of from 80 to 600° C. for about from 5 to 240 minutes.

15. The method according to claim 11, wherein said substrate is at least one member selected from the group consisting of a silicon wafer, $SiO_2$ wafer, and SiN wafer.

16. The method according to claim 11, further comprising:
irradiating said coating film with an electron beam or ultraviolet light.

* * * * *